(12) United States Patent
Dong et al.

(10) Patent No.: US 12,542,076 B2
(45) Date of Patent: Feb. 3, 2026

(54) DISPLAY APPARATUS AND METHOD OF FABRICATING DISPLAY APPARATUS

(71) Applicant: BOE Technology Group Co., Ltd., Beijing (CN)

(72) Inventors: Liming Dong, Beijing (CN); Zhao Li, Beijing (CN); Shiming Shi, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 0 days.

(21) Appl. No.: 18/679,722

(22) Filed: May 31, 2024

(65) Prior Publication Data

US 2024/0324276 A1 Sep. 26, 2024

Related U.S. Application Data

(63) Continuation of application No. 17/311,346, filed as application No. PCT/CN2020/114249 on Sep. 9, 2020, now Pat. No. 12,041,807.

(51) Int. Cl.
*H01L 33/44* (2010.01)
*F21V 8/00* (2006.01)
(Continued)

(52) U.S. Cl.
CPC .......... *G09F 9/301* (2013.01); *H10K 59/131* (2023.02); *H10K 77/111* (2023.02); *H10K 2102/311* (2023.02)

(58) Field of Classification Search
CPC .. G09F 9/301; H10K 50/8426; H10K 50/868; H10K 59/131; H10K 71/00;
(Continued)

(56) References Cited

U.S. PATENT DOCUMENTS 9,846,335 B2 12/2017 Bae
10,374,028 B1 8/2019 Lim et al.
(Continued)

FOREIGN PATENT DOCUMENTS

CN 105183230 A 12/2015
CN 108281387 A 7/2018
(Continued)

OTHER PUBLICATIONS

International Search Report & Written Opinion mailed May 27, 2021, regarding PCT/CN2020/114249.
(Continued)

*Primary Examiner* — Ajay Ojha
*Assistant Examiner* — Tsz K Chiu
(74) *Attorney, Agent, or Firm* — Intellectual Valley Law, P.C.

(57) ABSTRACT

A display apparatus is provided. The display apparatus includes a display panel having a display portion in a display region, a connecting portion, and a bending portion; a cover window on a first side of the display portion; a support layer between the display portion and the connecting portion; a first back film covering a back surface of the connecting portion, the first back film on a side of the connecting portion closer to the display portion; a metal plate between the support layer and the display portion; a second back film covering a surface of the display portion facing the connecting portion; and a metal support layer between the metal plate and the second back film. The bending portion connects the display portion and the connecting portion. The display apparatus includes a stress-reducing space. The stress-reducing space is open to the bending cavity.

20 Claims, 16 Drawing Sheets

(51) Int. Cl.
  *G09F 9/30* (2006.01)
  *H10K 59/131* (2023.01)
  *H10K 77/10* (2023.01)
  *H10K 102/00* (2023.01)

(58) Field of Classification Search
  CPC ............ H10K 77/111; H10K 2102/311; H10K 59/873; H10K 59/40; H10K 59/8794; H10K 59/12; H10K 59/38; H10K 59/8791; H10K 59/8792; H10K 50/87; H10K 59/871; H10K 50/84; H10K 59/82; H10K 50/841; H10K 59/1201; H10K 59/1213; H10K 59/1216; H10K 59/87; H10K 71/50; H10K 77/10; G06F 1/1637; G06F 1/1652; H05K 1/028; H05K 2201/10128; H05K 5/03; G02F 1/133305; G02F 1/133331; G02F 2202/28; G02F 1/133308
  See application file for complete search history.

(56) References Cited

U.S. PATENT DOCUMENTS

| | | | |
|---|---|---|---|
| 10,637,007 | B1 | 4/2020 | Wang et al. |
| 10,651,419 | B2 | 5/2020 | Lee |
| 10,755,991 | B2 | 8/2020 | Park et al. |
| 11,308,829 | B2 | 4/2022 | Xie |
| 2014/0217382 | A1* | 8/2014 | Kwon ................ H10K 50/8426 257/40 |
| 2015/0036300 | A1* | 2/2015 | Park ...................... H05K 1/147 156/212 |
| 2015/0382446 | A1* | 12/2015 | Kwon ................... G06F 1/1643 174/251 |
| 2016/0072094 | A1 | 3/2016 | Kim et al. |
| 2017/0108721 | A1 | 4/2017 | Bae |
| 2017/0212616 | A1 | 7/2017 | Zou et al. |
| 2018/0019293 | A1 | 1/2018 | Choi et al. |
| 2018/0114944 | A1 | 4/2018 | Son et al. |
| 2018/0160545 | A1 | 6/2018 | Kim et al. |
| 2018/0219165 | A1 | 8/2018 | Kwon et al. |
| 2018/0294427 | A1 | 10/2018 | Lee et al. |
| 2018/0341290 | A1 | 11/2018 | Sim et al. |
| 2019/0033918 | A1 | 1/2019 | Park et al. |
| 2019/0073961 | A1 | 3/2019 | Park et al. |
| 2019/0373719 | A1* | 12/2019 | Lee ........................ H10K 59/12 |
| 2020/0120807 | A1 | 4/2020 | Park et al. |
| 2020/0154581 | A1 | 5/2020 | Chen |
| 2020/0162596 | A1 | 5/2020 | Kim et al. |
| 2020/0163231 | A1 | 5/2020 | Park |
| 2021/0027665 | A1 | 1/2021 | Huang et al. |
| 2021/0328159 | A1 | 10/2021 | Zhou et al. |
| 2022/0293016 | A1 | 9/2022 | Yang et al. |
| 2022/0317355 | A1 | 10/2022 | Luo et al. |

FOREIGN PATENT DOCUMENTS

| | | |
|---|---|---|
| CN | 108628500 A | 10/2018 |
| CN | 108735103 A | 11/2018 |
| CN | 108766246 A | 11/2018 |
| CN | 108877519 A | 11/2018 |
| CN | 109065589 A | 12/2018 |
| CN | 109377883 A | 2/2019 |
| CN | 109445154 A | 3/2019 |
| CN | 109658829 A | 4/2019 |
| CN | 111047985 A | 4/2020 |
| CN | 111462634 A | 7/2020 |
| WO | 2019228160 A1 | 12/2019 |

OTHER PUBLICATIONS

Non-Final Office Action in the U.S. Appl. No. 17/311,346, dated Oct. 5, 2023.
Response to Non-Final Office Action in the U.S. Appl. No. 17/311,346, dated Dec. 25, 2023.
Notice of Allowance in the U.S. Appl. No. 17/311,346, dated Apr. 24, 2024.
The Extended European Search Report in the European Patent Application No. 20952732.4, dated May 9, 2023.
First Office Action in the Chinese Patent Application No. 202080001854.5, dated Mar. 1, 2023; English translation attached.
Rejection Decision in the Chinese Patent Application No. 202080001854.5, dated Sep. 21, 2023; English translation attached.
Decision of Reexamination (Revoked by former Examination Department) in the Chinese Patent Application No. 202080001854.5, dated Jan. 15, 2024; English translation attached.

* cited by examiner

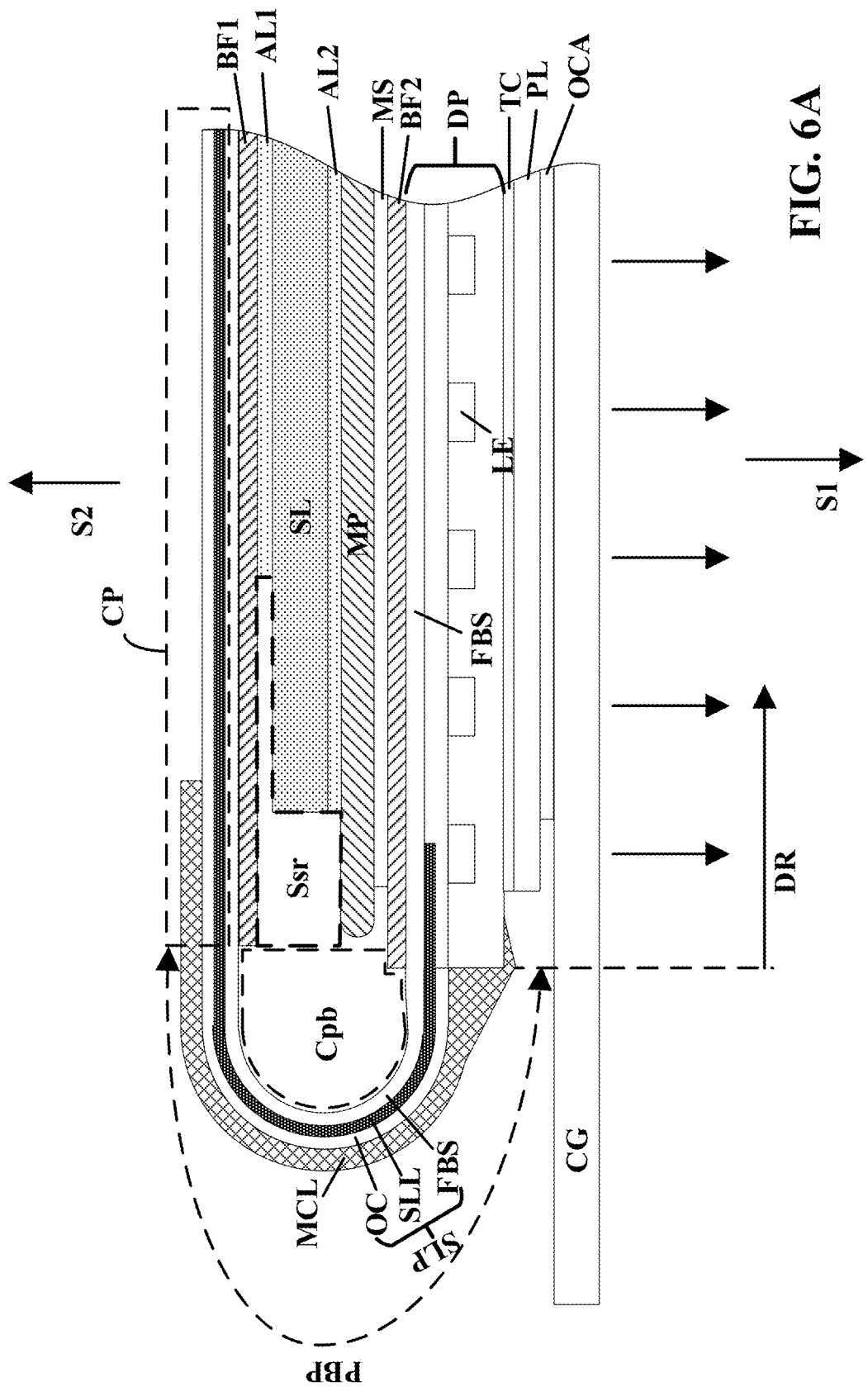

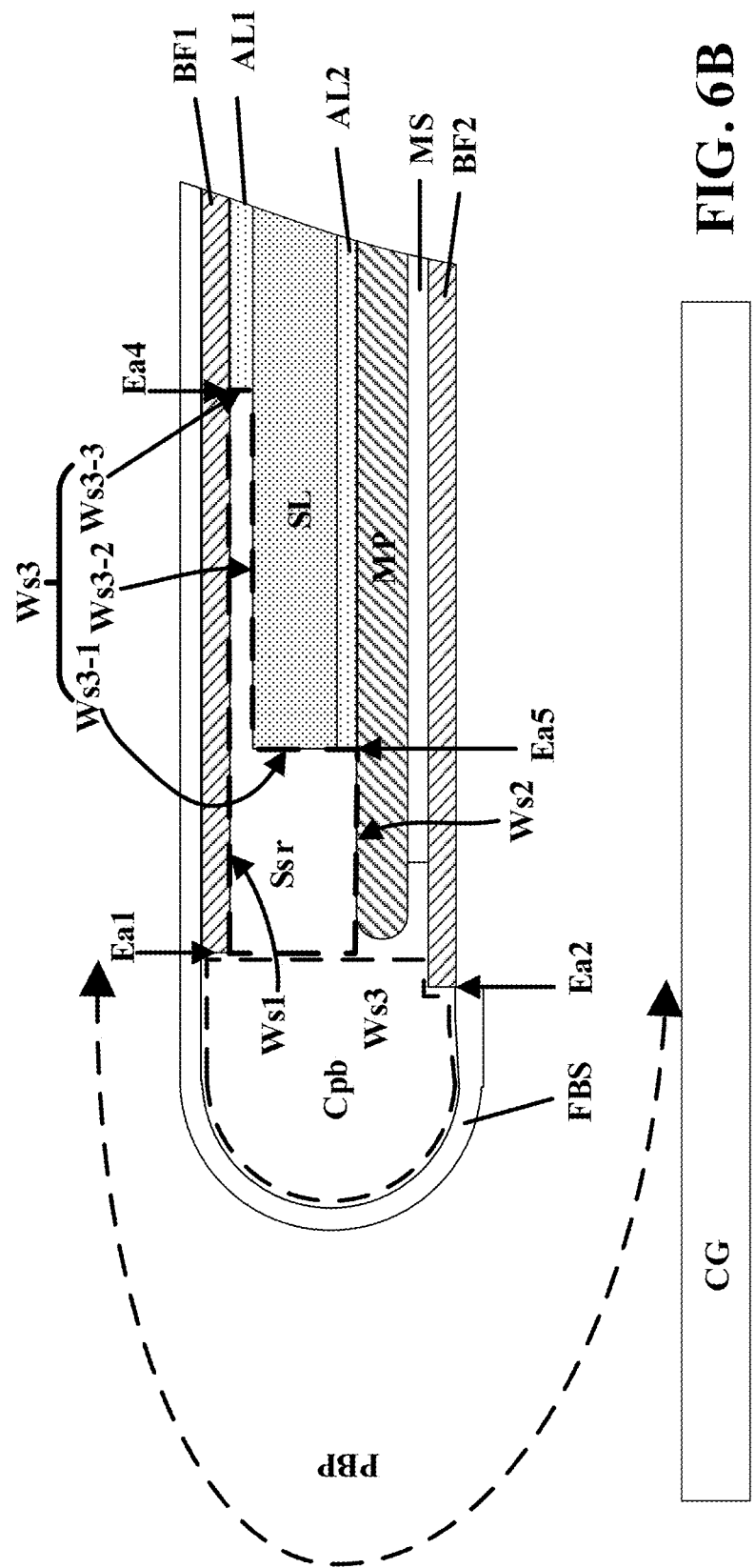

DISPLAY APPARATUS AND METHOD OF FABRICATING DISPLAY APPARATUS

CROSS-REFERENCE TO RELATED APPLICATION

This application is a continuation of U.S. application Ser. No. 17/311,346, filed Sep. 9, 2020, which is a national stage application under 35 U.S.C. § 371 of International Application No. PCT/CN2020/114249, filed Sep. 9, 2020. Each of the forgoing applications is herein incorporated by reference in its entirety for all purposes.

TECHNICAL FIELD

The present invention relates to display technology, more particularly, to a display apparatus and a method of fabricating a display apparatus.

BACKGROUND

A flexible display apparatus is a bendable or deformable display apparatus having a flexible display panel. Examples of flexible display apparatuses include a flexible organic light emitting diode (OLED) display apparatus, a flexible electrophoretic display (EPD) apparatus, and a flexible liquid crystal display (LCD) apparatus. As a new generation display apparatus, the flexible display apparatus is thinner and lighter, having high contrast, high responsiveness, and high brightness. It also provides full color and a wide viewing angle. The flexible display apparatus has found a wide range of applications in mobiles phones, personal digital assistance (PDAs), digital cameras, on-board displays, notebook computers, on-wall televisions, as well as various military applications. A flexible display apparatus includes a flexible array substrate. A base substrate of the flexible array substrate can be made of flexible material such as plastic.

SUMMARY

In one aspect, the present disclosure provides a display apparatus, comprising a display panel having a display portion in a display region, a connecting portion, and a bending portion; a cover window on a first side of the display portion; a support layer between the display portion and the connecting portion; a first back film covering a back surface of the connecting portion, the first back film on a side of the connecting portion closer to the display portion; a metal plate between the support layer and the display portion; a second back film covering a surface of the display portion facing the connecting portion; and a metal support layer between the metal plate and the second back film; wherein the bending portion connects the display portion and the connecting portion, wherein the bending portion is bent so that the connecting portion is facing a second side of the display portion, forming a bending cavity that is surrounded by the bending portion, the second side being opposite to the first side; the display apparatus comprises a stress-reducing space having a first side wall comprising a first exposed surface of a first exposed portion of the first back film, a second side wall comprising a second exposed surface of a second exposed portion of the metal plate, and a third side wall comprising a first surface of the support layer; and the stress-reducing space is open to the bending cavity.

Optionally, a first boundary between the bending portion and the connecting portion is along a first edge of the first back film; and the bending portion is absent of the first back film.

Optionally, a second boundary between the bending portion and the display portion is along a second edge of the second back film; and the bending portion is absent of the second back film.

Optionally, the cover window is on a side of the display portion away from the support layer; and an orthographic projection of the first back film on the cover window covers an orthographic projection of the support layer on the cover window by a first margin having a first width greater than zero along a direction from the support layer to the bending portion.

Optionally, the first width is in a range of 200 μm to 500 μm.

Optionally, the display apparatus further comprises a first adhesive layer attaching the support layer to the first back film; and a second adhesive layer attaching the support layer to the metal plate; wherein the third side wall further comprises a second surface of the first adhesive layer and a third surface of the second adhesive layer.

Optionally, the display apparatus further comprises a first adhesive layer attaching the support layer to the first back film; and a second adhesive layer attaching the support layer to the metal plate; wherein the stress-reducing space extends into a gap between the first back film and the support layer, the first adhesive layer being absent in the gap.

Optionally, the third side wall further comprises a second surface of the first adhesive layer, a third surface of the second adhesive layer, and a third exposed surface of a third exposed portion of the support layer.

Optionally, the third side wall is a step wall; the third exposed surface is substantially parallel to the first exposed surface and the second exposed surface; the second surface of the first adhesive layer, the first surface of the support layer, and the third surface of the second adhesive layer are respectively substantially perpendicular to the first exposed surface, the second exposed surface, and the third exposed surface; and the third exposed surface connects the first surface of the support layer and the second surface of the first adhesive layer.

Optionally, the cover window is on a side of the display portion away from the support layer; and an orthographic projection of the second adhesive layer on the cover window covers an orthographic projection of the first adhesive layer on the cover window by a second margin having a second width greater than zero along a direction from the support layer to the bending portion.

Optionally, the second width is in a range of 500 μm to 1000 μm.

Optionally, the display apparatus comprises a flexible base substrate extending throughout the display portion, the bending portion and the connecting portion as a unitary structure; wherein the bending cavity is partially surrounded by a part of the flexible base substrate in the bending portion; and a virtual boundary through which the stress-reducing space and the bending cavity open to each other is defined by a plane crossing over a first edge of the first back film abutting the bending portion.

Optionally, the display apparatus comprises a signal line layer extends from the bending portion into the connecting portion; wherein a part of the signal line layer in the bending portion is on a side of the flexible base substrate away from the bending cavity; and a part of the signal line layer in the connecting portion is on a side of the flexible base substrate away from the first back film.

Optionally, the display apparatus further comprises an overcoat layer in the bending portion and on a side of the signal line layer away from the flexible base substrate and the bending cavity; and a coating layer in the bending portion and on a side of the overcoat layer away from the signal line layer.

Optionally, the cover window is on a side of the display portion away from the support layer; wherein an orthographic projection of the second back film on the cover window covers an orthographic projection of the first back film on the cover window by a third margin having a third width greater than zero along a direction from the support layer to the bending portion.

Optionally, the display apparatus further comprises a second optically clear adhesive layer between the metal support layer and the second back film, and attaching the metal support layer and the second back film together; and an Embo-type adhesive layer between the metal support layer and the metal plate, attaching the metal support layer and the metal plate together.

Optionally, an orthographic projection of the metal support layer on the cover window covers an orthographic projection of the second optically clear adhesive layer on the cover window by a fourth margin having a fourth width greater than zero along a direction from the support layer to the bending portion.

Optionally, the fourth width is in a range of 50 μm to 500 μm.

Optionally, the display apparatus further comprises a touch control structure on a side of the display portion away from the second back film; a polarizer on a side of the touch control structure away from the display portion; and an optically clear adhesive layer on a side of the polarizer away from the touch control structure; wherein the cover window is on a side of the optically clear adhesive layer away from the polarizer; and the optically clear adhesive layer attaches the cover window to the polarizer.

In another aspect, the present disclosure provides a method of fabricating a display apparatus, comprising forming a display panel comprising a display portion in a display region, a connecting portion, and a bending portion connecting the display portion and the connecting portion, wherein a flexible base substrate extends throughout the display portion, the bending portion and the connecting portion as a unitary structure that is substantially flat; forming a back film covering a surface of the flexible base substrate; removing a portion of the back film in a region having the bending portion, thereby forming a first back film covering a surface of the connecting portion and a second back film covering a surface of the display portion; bending the bending portion so that the first back film is facing the second back film, thereby forming a bending cavity that is surrounded by the bending portion; providing a support layer between the display portion and the connecting portion; covering a surface of the display portion facing the connecting portion using a second back film; providing a metal plate between the support layer and the display portion; providing a cover window on a first side of the display portion; and providing a metal support layer between the metal plate and the second back film; wherein the support layer is provided to form a stress-reducing space having a first side wall comprising a first exposed surface of a first exposed portion of the first back film, a second side wall comprising a second exposed surface of a second exposed portion of the metal plate, and a third side wall comprising a first surface of the support layer; and the stress-reducing space is open to the bending cavity.

BRIEF DESCRIPTION OF THE FIGURES

The following drawings are merely examples for illustrative purposes according to various disclosed embodiments and are not intended to limit the scope of the present invention.

FIG. 6A is a cross-section view around a bending portion of a display apparatus in some embodiments according to the present disclosure.

FIG. 6B is a zoom-in view of a region around a stress-reducing space and a bending cavity in a display apparatus in some embodiments according to the present disclosure.

DETAILED DESCRIPTION

The disclosure will now be described more specifically with reference to the following embodiments. It is to be noted that the following descriptions of some embodiments are presented herein for purpose of illustration and description only. It is not intended to be exhaustive or to be limited to the precise form disclosed.

The present disclosure provides, inter alia, a display apparatus and a method of fabricating a display apparatus that substantially obviate one or more of the problems due to limitations and disadvantages of the related art. In one aspect, the present disclosure provides a display apparatus. In some embodiments, the display apparatus includes a display panel having a display portion in a display region, a connecting portion, and a bending portion; a cover window on a first side of the display portion; wherein the bending portion connects the display portion and the connecting portion; a support layer between the display portion and the connecting portion; a first back film covering a surface of the connecting portion facing the display portion; a first adhesive layer attaching the support layer to the first back film; a metal plate between the support layer and the display portion; and a second adhesive layer attaching the support layer to the metal plate. Optionally, the display apparatus includes a stress-reducing space having a first side wall including a first exposed surface of a first exposed portion of the first back film, a second side wall including a second exposed surface of a second exposed portion of the metal plate, and a third side wall including a surface of the support layer. Optionally, the stress-reducing space is open to a bending cavity.

As used herein, the term "display region" refers to a region of a display panel in a display apparatus where image is actually displayed. Optionally, the display region may include both a subpixel region and an inter-subpixel region. A subpixel region refers to a light emission region of a subpixel, such as a region corresponding to a pixel electrode in a liquid crystal display or a region corresponding to a light emissive layer in an organic light emitting diode display panel. An inter-subpixel region refers to a region between adjacent subpixel regions, such as a region corresponding to a black matrix in a liquid crystal display or a region corresponding to a pixel definition layer in an organic light emitting diode display panel. Optionally, the inter-subpixel region is a region between adjacent subpixel regions in a same pixel. Optionally, the inter-subpixel region is a region between two adjacent subpixel regions from two adjacent pixels. Optionally, the display apparatus is a flexible display apparatus.

Figure 1:
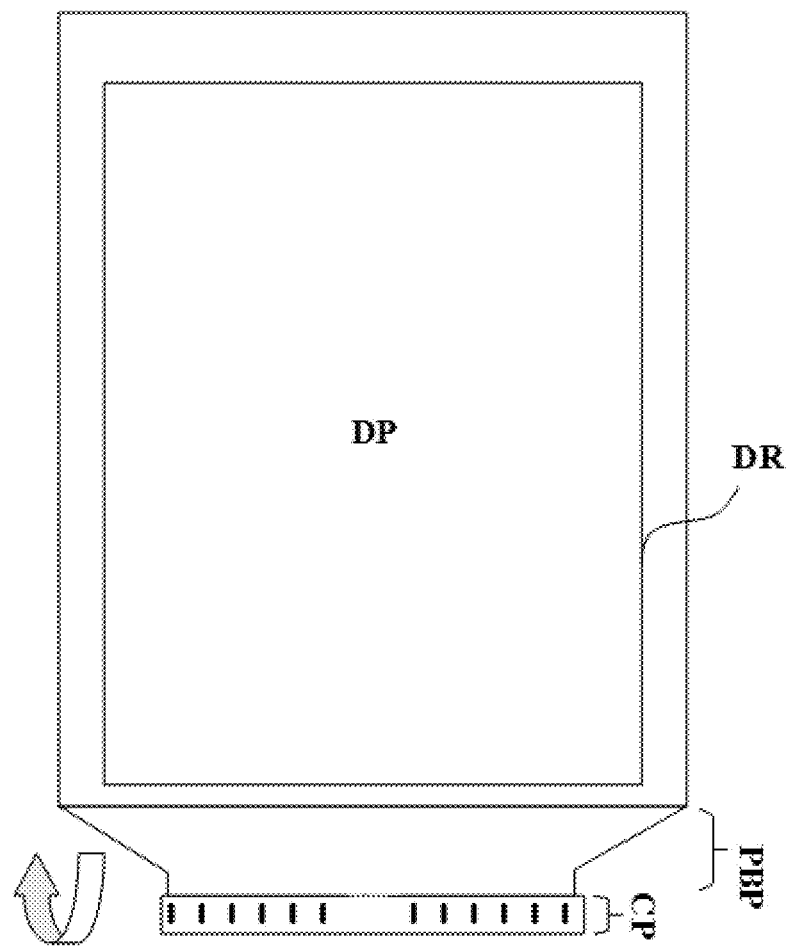
FIG. 1 is a schematic diagram of a display apparatus in some embodiments according to the present disclosure.

FIG. 1 is a schematic diagram of a display apparatus in some embodiments according to the present disclosure. Referring to FIG. 1, the display apparatus includes a display panel having a display portion DP in a display region DR where an image is displayed by an array of subpixels in the display portion DP. A peripheral region of the display apparatus surrounds the display region DR. Although a rectangular display region is shown in FIG. 1, the display region DR may have any appropriate shapes and dimensions. Examples of appropriate shapes of the display region DR include a circular shape, a square shape, a hexagonal shape, an elliptical shape, and an irregular polygon shape. Each subpixel in the display region DR may be electrically connected to a pixel driving circuit, which includes one or more thin film transistors. The display apparatus further includes gate lines and data lines for providing signals for driving image display in the display region DR. These signal lines are electrically connected to one or more integrated circuits such as gate driving integrated circuit and data driving integrated circuit. The one or more integrated circuits may be integrated into the display panel (chip-on-glass) or mounted on a flexible printed circuit (chip-on-film). The one or more integrated circuits are electrically connected to the flexible printed circuit. The display apparatus further includes various other signal lines such as a high voltage supply line VDD, a low voltage supply line VSS, and an initiation signal line.

Figure 2:
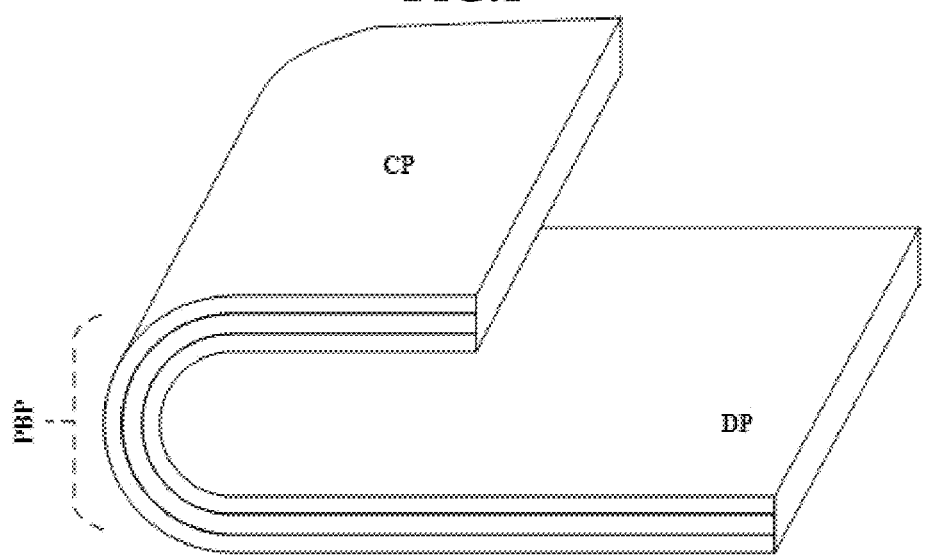
FIG. 2 is a schematic diagram of a display apparatus in some embodiments according to the present disclosure.

The display apparatus further includes a bending portion PBP and a connecting portion CP. The connecting portion CP is a portion where a flexible printed circuit can be bonded to the display apparatus. The bending portion PBP is flexible or bendable. As shown in FIG. 1, the bending portion PBP may be bent along the direction of an arrow depicted in FIG. 1 so that the connecting portion CP can be bent toward a back side of the display portion DP. FIG. 2 is a schematic diagram of a display apparatus in some embodiments according to the present disclosure. FIG. 2 depicts a display apparatus in which the bending portion PBP is bent, and the connecting portion CP is bent toward the back side of the display portion DP.

Figure 3:
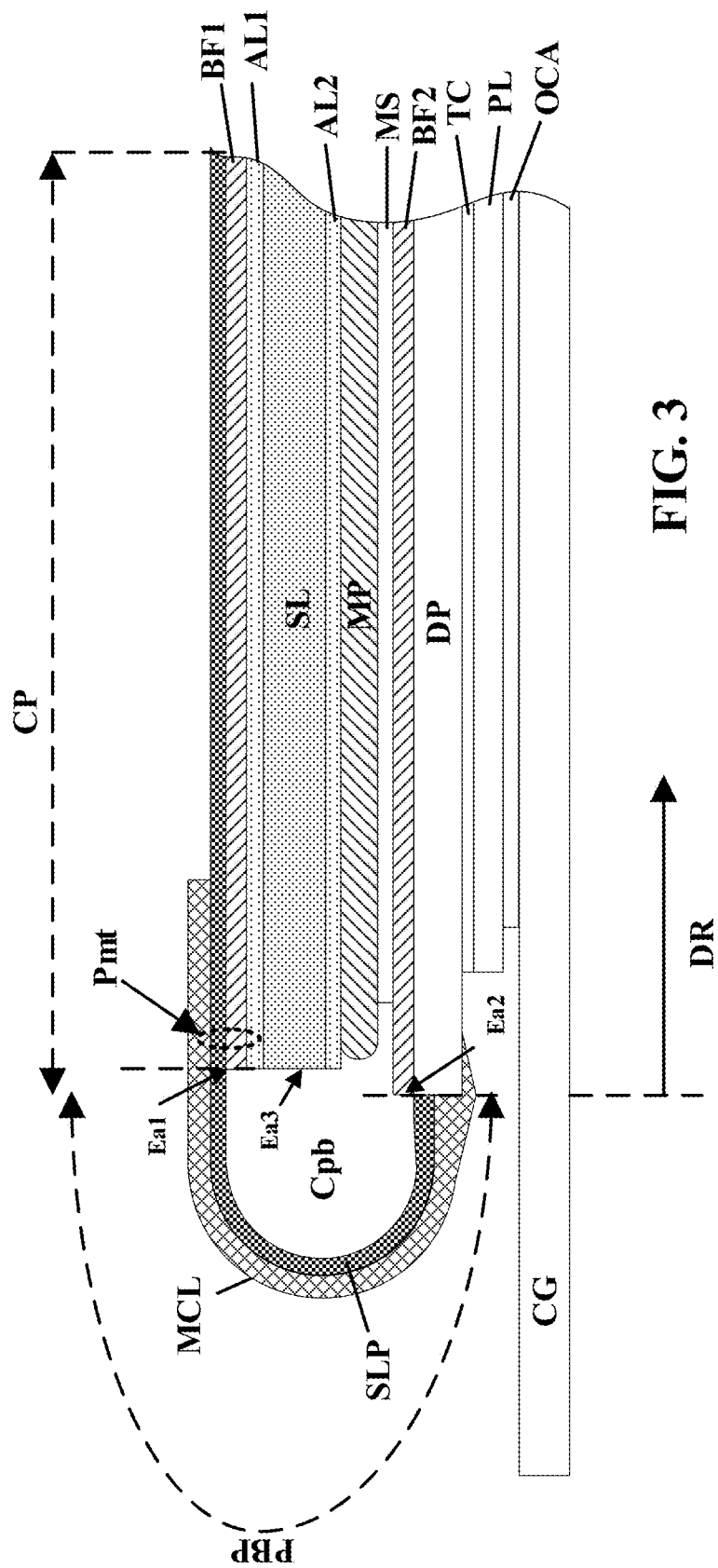
FIG. 3 is a cross-section view around a bending portion of a display apparatus in some embodiments according to the present disclosure.

FIG. 3 is a cross-section view around a bending portion of a display apparatus in some embodiments according to the present disclosure. Referring to FIG. 3, the display apparatus in some embodiments includes a display portion DP in a display region DR; a connecting portion CP; a bending portion PBP connecting the display portion DP and the connecting portion CP; a support layer SL between the display portion DP and the connecting portion CP; a first back film BF1 covering a surface of the connecting portion CP facing the display portion DP; a first adhesive layer AL1 attaching the support layer SL to the first back film BF1; a metal plate MP between the support layer SL and the display portion DP; and a second adhesive layer AL2 attaching the support layer SL to the metal plate MP. As shown in FIG. 3, the display apparatus in some embodiments includes a bending cavity Cpb that is partially surrounded by the bending portion PBP. As shown in FIG. 3, the bending portion PBP includes a signal line portion SLP and a coating layer MCL coated on an outer surface of the signal line portion SLP. The bending cavity Cpb is partially surrounded by the signal line portion SLP.

Optionally, the support layer SL includes a buffering material having buffering function, for example, an organic material such as a foam. Optionally, the support layer SL includes a silicone. Optionally, the support layer SL includes a double-sided adhesive layer. Optionally, the support layer SL includes a metallic material such as stainless steel.

The bending cavity Cpb on a first side (e.g., a left side) has a first wall formed by the bending portion PBP, the bending cavity Cpb on a second side (e.g., a right side) has a second wall formed by lateral sides of the first back film BF1, the first adhesive layer AL1, the support layer SL, and the second adhesive layer AL2. In some embodiments, the display apparatus further includes a second back film BF2 covering a surface of the display portion DP facing the connecting portion CP; and a metal support layer MS between the metal plate MP and the second back film BF2. Optionally, the bending cavity Cpb has a third wall formed by lateral sides of the metal plate MP, the metal support layer MS, and the second back film BF2, as well as an exposed surface of an exposed portion of the second back film BF2.

In some embodiments, edges of the support layer SL and the first back film BF1 on a side defining the second wall of the bending cavity Cpb are aligned with respect to each other. For example, the display apparatus in some embodiments further includes a cover window CG on a side of the display portion DP away from the support layer SL; an orthographic projection of a first edge Ea1 of the first back film BF1 on the cover window CG at least partially overlaps with (e.g., completely overlaps with) an orthographic projection of a third edge Ea3 of the support layer SL on the cover window CG.

Optionally, the first edge Ea1 of the first back film BF1 on the side defining the second wall of the bending cavity Cpb are mis-aligned with a second edge Ea2 of the second back film BF2 on the side defining the third wall of the bending cavity Cpb. For example, the orthographic projection of a first edge Ea1 of the first back film on the cover window CG does not overlaps with an orthographic projection of a second edge Ea2 of the second back film BF2 on the cover window CG, and spaced apart by an alignment distance. The alignment distance between orthographic projections of the edges of the first back film BF1 and the second back film BF2 on the cover window CG provides a basis for bending the bending portion PBP toward the back side of the display portion. The bending process requires the alignment distance to be within a certain range.

Because the display apparatus includes flexible material (such as flexible base substrate and back film), the bending process results in a relatively large tensile stress between adjacent layers (e.g., between the bending portion and the back film), which in turn leads to a relatively large deformation around the bending portion PBP.

Figure 4:
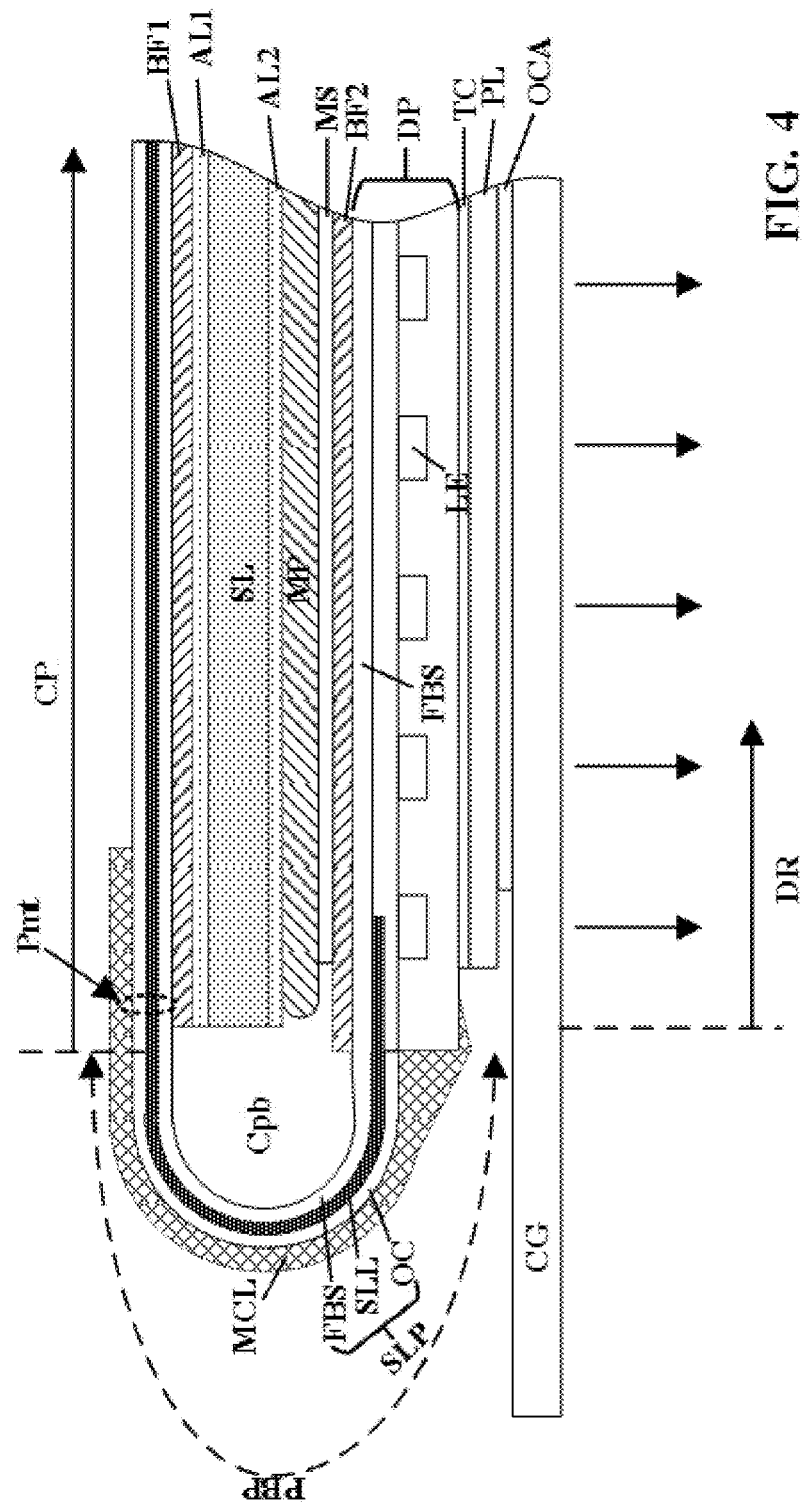
FIG. 4 is a cross-section view around a bending portion of a display apparatus in some embodiments according to the present disclosure.

FIG. 4 is a cross-section view around a bending portion of a display apparatus in some embodiments according to the present disclosure. Referring to FIG. 4, a more detailed structure of the display apparatus in some embodiments is depicted. The display apparatus in some embodiments includes a flexible base substrate FBS extending throughout the display portion DP, the bending portion PBP, and the connecting portion CP as a unitary structure. The bending cavity is partially surrounded by a part of the flexible base substrate FBS in the bending portion PBP. The display apparatus in some embodiments further includes a signal line layer SLL extends from the bending portion PBP into the connecting portion CP. A part of the signal line layer SLL in the bending portion PBP is on a side of the flexible base substrate FBS away from the bending cavity Cpb. A part of the signal line layer SLL in the connecting portion CP is on a side of the flexible base substrate FBS away from the first back film BF1. The signal line portion SLP includes the signal line layer SLL on the flexible base substrate FBS, and an overcoat layer OC on a side of the signal line layer SLL away from the flexible base substrate FBS. The coating layer MCL is on a side of the overcoat layer OC away from the signal line layer SLL.

In one example, a movement of the support layer SL (e.g., toward the right side of the bending cavity Cpb) relative to the first back film BF1, the flexible base substrate FBS, and the signal line layer SLL results in a relatively high tensile stress among these layers. The resulting deformation can sometimes damage the signal lines in the signal line layer SLL, which results in defects in the display apparatus such as dark lines and bright lines. The inventors of the present disclosure discovers that the position having a maximum tensile stress is at a position Pmt in close proximity to the bending cavity Cpb. Moreover, the inventors of the present disclosure discovers that reduction of tensile stress at this position can significantly alleviate the issue of damaged signal lines, and eliminate the defects due to the damaged signal lines.

Figure 5A:
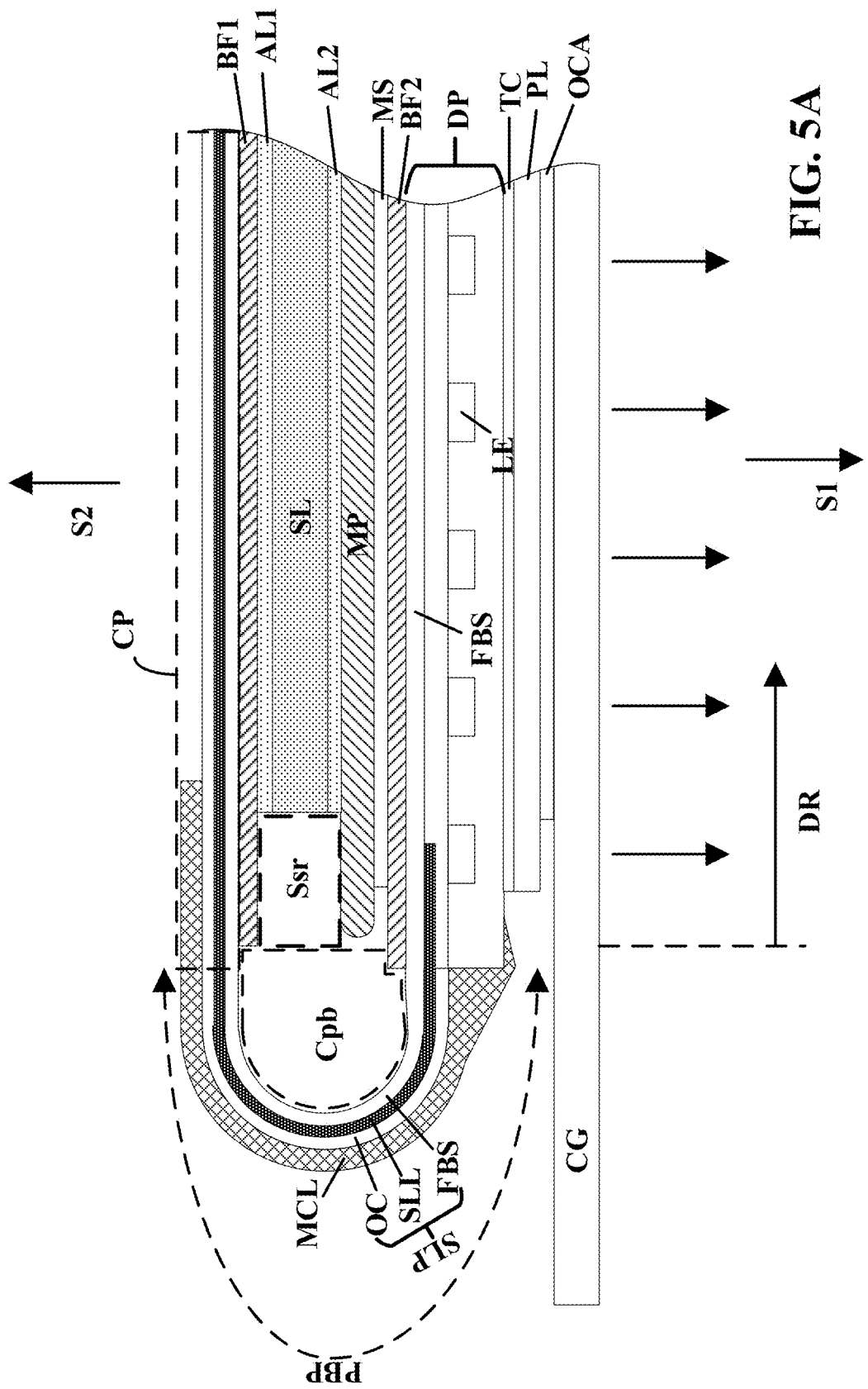
FIG. 5A is a cross-section view around a bending portion of a display apparatus in some embodiments according to the present disclosure.

FIG. 5A is a cross-section view around a bending portion of a display apparatus in some embodiments according to the present disclosure. Referring to FIG. 5A, the display apparatus in some embodiments includes a stress-reducing space Ssr open to the bending cavity Cpb. The stress-reducing space Ssr extends into a space between the first back film BF1 and the metal plate MP.

Figure 5B:
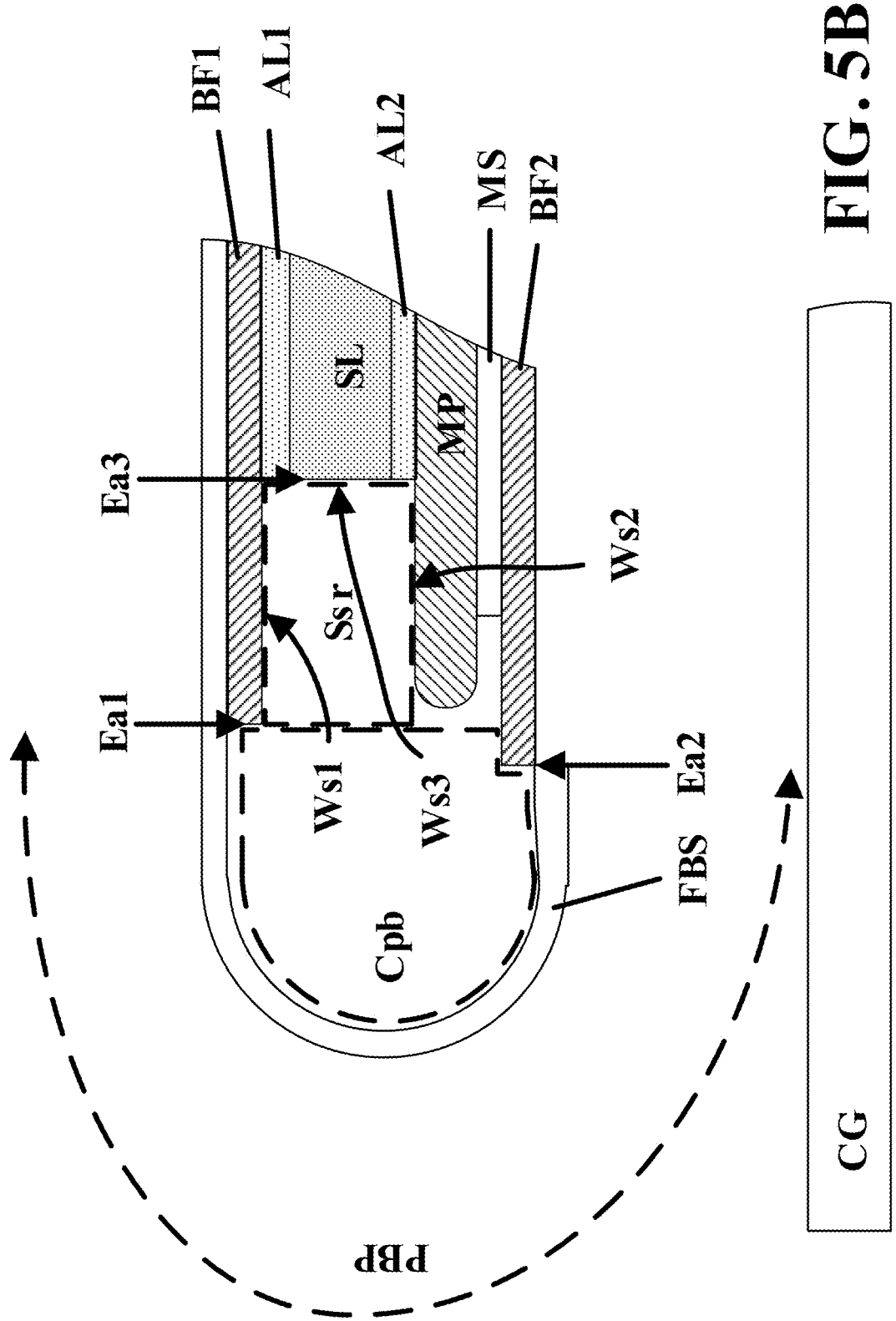
FIG. 5B is a zoom-in view of a region around a stress-reducing space and a bending cavity in a display apparatus in some embodiments according to the present disclosure.
Figure 5C:
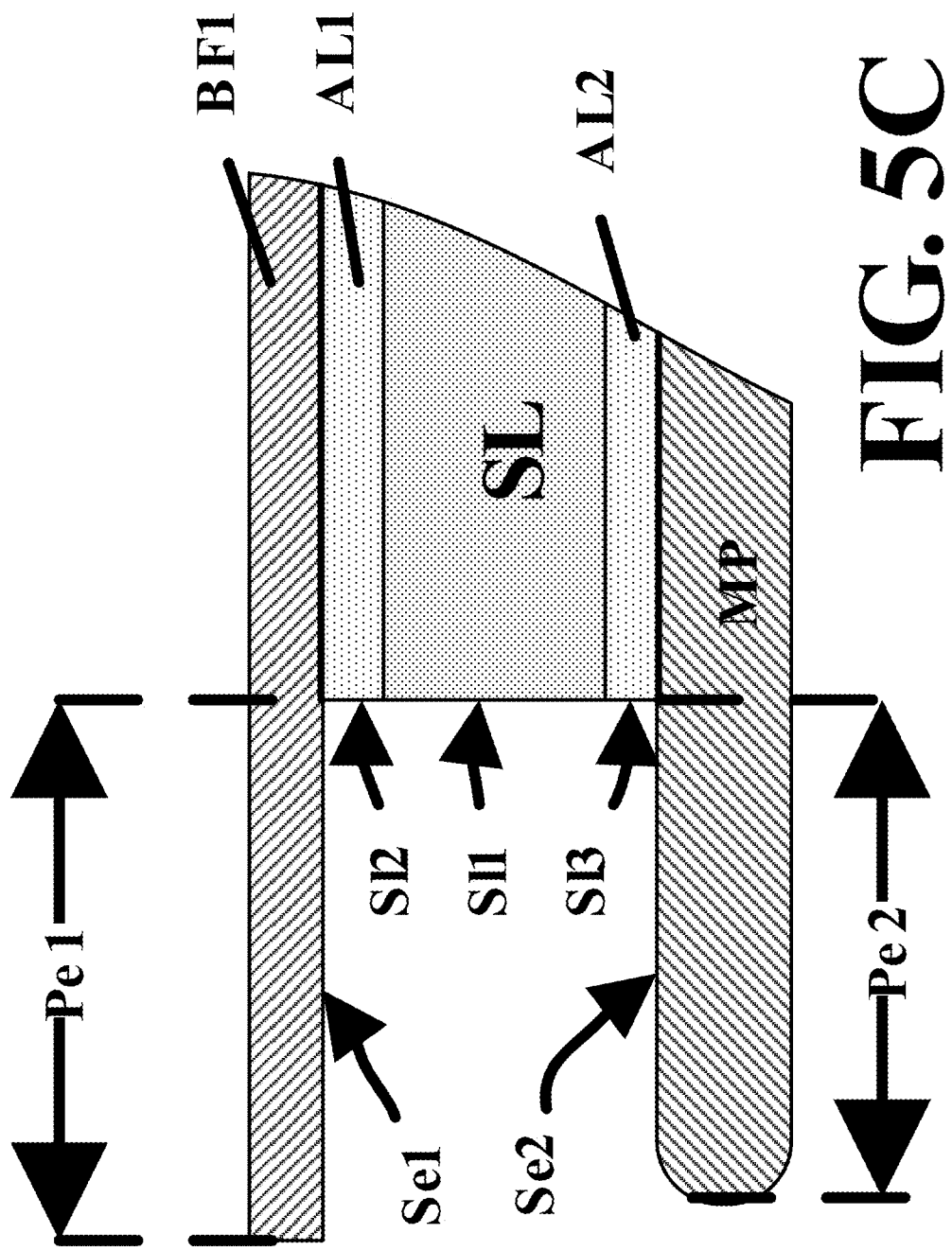
FIG. 5C is a schematic diagram illustrating a partial structure of a region around a stress-reducing space in a display apparatus in some embodiments according to the present disclosure.

FIG. 5B is a zoom-in view of a region around a stress-reducing space and a bending cavity in a display apparatus in some embodiments according to the present disclosure. FIG. 5C is a schematic diagram illustrating a partial structure of a region around a stress-reducing space in a display apparatus in some embodiments according to the present disclosure. Referring to FIG. 5A to FIG. 5C, the stress-reducing space Ssr in some embodiments has a first side wall Ws1 including a first exposed surface Se1 of a first exposed portion Pe1 of the first back film BF1, a second side wall Ws2 including a second exposed surface Se2 of a second exposed portion Pe2 of the metal plate MP, and a third side wall Ws3 including a first surface Sl1 (e.g., a first lateral surface) of the support layer SL. Optionally, the stress-reducing space is open to a bending cavity Cpb.

In some embodiments, the connecting portion CP and the display portion DP are parts of a stacked structure in the display apparatus. Referring to FIG. 5A, the display portion DP may be used as a reference for describing the structure of the stacked structure. On a light emitting image display side S1 of the display portion DP, the stacked structure in some embodiments includes one or more of a touch control structure TC on the display portion DP; a polarizer PL on a side of the touch control structure TC away from the display portion DP; an optically clear adhesive layer OCA on a side of the polarizer PL away from the touch control structure TC; and a cover window CG on a side of the optically clear adhesive layer OCA away from the polarizer PL. The optically clear adhesive layer OCA attaches the cover window CG to the polarizer. On a back side S2 of the display portion DP, the stacked structure in some embodiments includes one or more of a second back film BF2 on the display portion DP, a metal support layer MS on a side of the second back film BF2 away from the display portion DP; a metal plate MP on a side of the metal support layer MS away from the second back film BF2; a second adhesive layer AL2 on a side of the metal plate MP away from the metal support layer MS; a support layer SL on a side of the second adhesive layer AL2 away from the metal plate MP; a first adhesive layer AL1 on a side of the support layer SL away from the second adhesive layer AL2, a first back film BF1 on a side of the first adhesive layer AL1 away from the support layer SL; a flexible base substrate FBS on a side of the first back film BF1 away from the first adhesive layer AL1; a signal line layer SLL on a side of the flexible base substrate FBS away from the first back film BF1; and an overcoat layer OC on a side of the signal line layer SLL away from the flexible base substrate FBS.

The metal plate MP provides support for the stacked structure, and dissipates heat from the display apparatus. The metal plate MP has nut holes therein for assembly with the other portions of the display apparatus. The metal support layer MS provides support for the stacked structure. It also enhances the resilience of the display apparatus in the portion having the stacked structure. The support layer SL mainly functions as a cushion.

In some embodiments, the bending portion PBP includes a flexible base substrate FBS, a signal line layer SLL on the flexible base substrate FBS, an overcoat layer OC on a side of the signal line layer SLL away from the flexible base substrate FBS, and a coating layer MCL on a side of the overcoat layer OC away from the signal line layer SLL.

In some embodiments, the connecting portion CP includes a flexible base substrate FBS, a signal line layer SLL on the flexible base substrate FBS, and an overcoat layer OC on a side of the signal line layer SLL away from the flexible base substrate FBS. Optionally, the coating layer MCL at least partially extends from the bending portion PBP into the connecting portion CP, a portion of the coating layer MCL in the connecting portion CP is on a side of the overcoat layer OC away from the signal line layer SLL.

Referring to FIG. 5A to FIG. 5C, in some embodiments, a first boundary between the bending portion PBP and the connecting portion CP is along a first edge Ea1 of the first back film BF1. The bending portion PBP is absent of the first back film BF1, e.g., the first back film BF1 does not extend into the bending portion PBP. In some embodiments, a second boundary between the bending portion PBP and the display portion DP is along a second edge Ea2 of the second back film BF2. The bending portion PBP is absent of the second back film BF2, e.g., the second back film BF2 does not extend into the bending portion PBP. By removing the back film in the bending portion PBP, the tensile stress around this region can be further reduced. Thus, the boundaries of the bending portion PBP is defined by edges of the back films including the first edge Ea1 of the first back film BF1 and the second edge Ea2 of the second back film BF2. Optionally, the bending portion PBP in the display apparatus is a portion absent of back film.

Figure 5D:
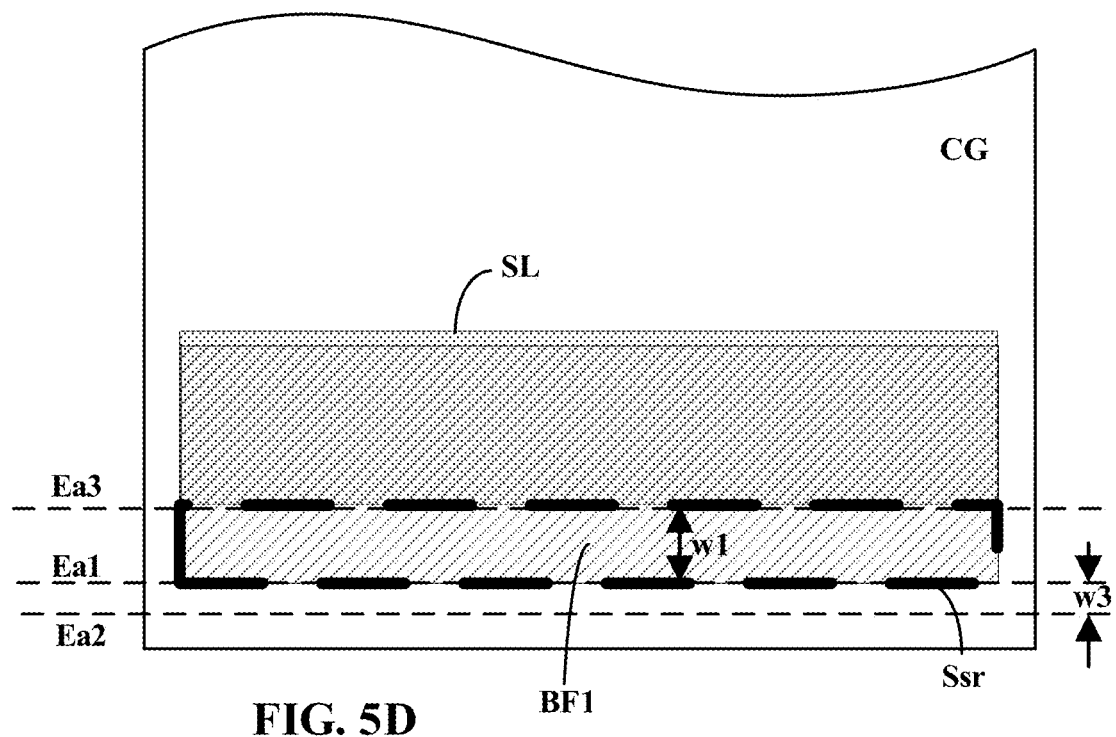
FIG. 5D is a plan view of a support layer, a first back film, and a cover window in a display apparatus in some embodiments according to the present disclosure.
Figure 5E:
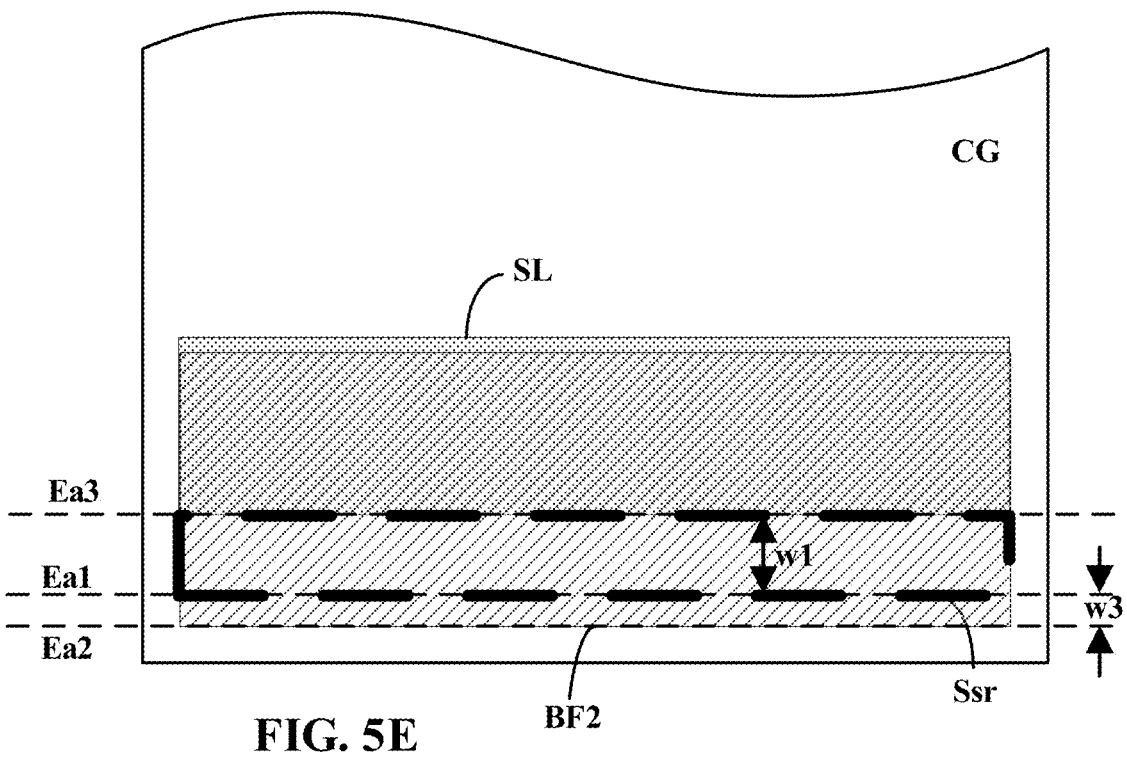
FIG. 5E is a plan view of a support layer, a second back film, and a cover window in a display apparatus in some embodiments according to the present disclosure.

FIG. 5D is a plan view of a support layer, a first back film, and a cover window in a display apparatus in some embodiments according to the present disclosure. FIG. 5E is a plan view of a support layer, a second back film, and a cover window in a display apparatus in some embodiments according to the present disclosure. Referring to FIG. 5A to FIG. 5E, in some embodiments, an orthographic projection of the first back film BF1 on the cover window CG covers an orthographic projection of the support layer SL on the cover window CG by a first margin having a first width w1 greater than zero along a direction from the support layer SL to the bending portion PBP. As shown in FIG. 5A to FIG. 5E, an orthographic projection of a first edge Ea1 of the first back film BF1 on the cover window CG is non-overlapping with an orthographic projection of a third edge Ea3 of the support layer SL on the cover window CG. The orthographic projection of the first edge Ea1 of the first back film BF1 on the cover window CG is spaced apart from the orthographic projection of the third edge Ea3 of the support layer SL on the cover window CG by the first width w1 greater than zero. Optionally, the first width w1 is in a range of 20 μm to 1500 μm, e.g., 20 μm to 100 μm, 100 μm to 200 μm, 200 μm to 300 μm, 300 μm to 400 μm, 400 μm to 500 μm, 500 μm to 600 μm, 600 μm to 700 μm, 700 μm to 800 μm, 800 μm to 900 μm, 900 μm to 1000 μm, 1000 μm to 1100 μm, 1100 μm to 1200 μm, 1200 μm to 1300 μm, 1300 μm to 1400 μm, or 1400 μm to 1500 μm.

Optionally, the first width w1 referred to a minimum width of the first margin, or a minimum spaced apart distance between the orthographic projection of the first edge Ea1 of the first back film BF1 on the cover window CG and the orthographic projection of the third edge Ea3 of the support layer SL on the cover window CG.

Optionally, the first width w1 referred to an average width of the first margin, or an average spaced apart distance between the orthographic projection of the first edge Ea1 of the first back film BF1 on the cover window CG and the orthographic projection of the third edge Ea3 of the support layer SL on the cover window CG.

Optionally, the first width w1 referred to a maximum width of the first margin, or a maximum spaced apart distance between the orthographic projection of the first edge Ea1 of the first back film BF1 on the cover window CG and the orthographic projection of the third edge Ea3 of the support layer SL on the cover window CG.

Referring to FIG. 5A to FIG. 5C, in some embodiments, the third side wall Ws3 includes a first surface S11 (e.g., a first lateral surface) of the support layer SL, a second surface S12 (e.g., a second lateral surface) of the first adhesive layer AL1, and a third surface S13 (e.g., a third lateral surface) of the second adhesive layer AL2.

The present display apparatus has a stress-reducing space Ssr for reducing tensile stress that causes damages in the signal lines. The inventors of the present disclosure discovers that the stress-reducing space Ssr significantly reduces the tensile stress in regions adjacent to the bending portion PBP. For example, a maximum tensile stress measured in regions adjacent to the bending portion PBP in the display apparatus as shown in FIG. 5A is approximately 0.00360 pascal when the width w1 is approximately 200 μm, and can be further reduced to 0.00278 pascal when the width w1 is further increased to approximately 500 μm. In comparison, the maximum tensile stress measured at the position Pmt in FIG. 3 or FIG. 4 is 0.00484 pascal. Surprisingly and unexpected, the maximum tensile stress can be reduced by at least 25% and as much as around 42% in the present display apparatus.

Figure 6C:
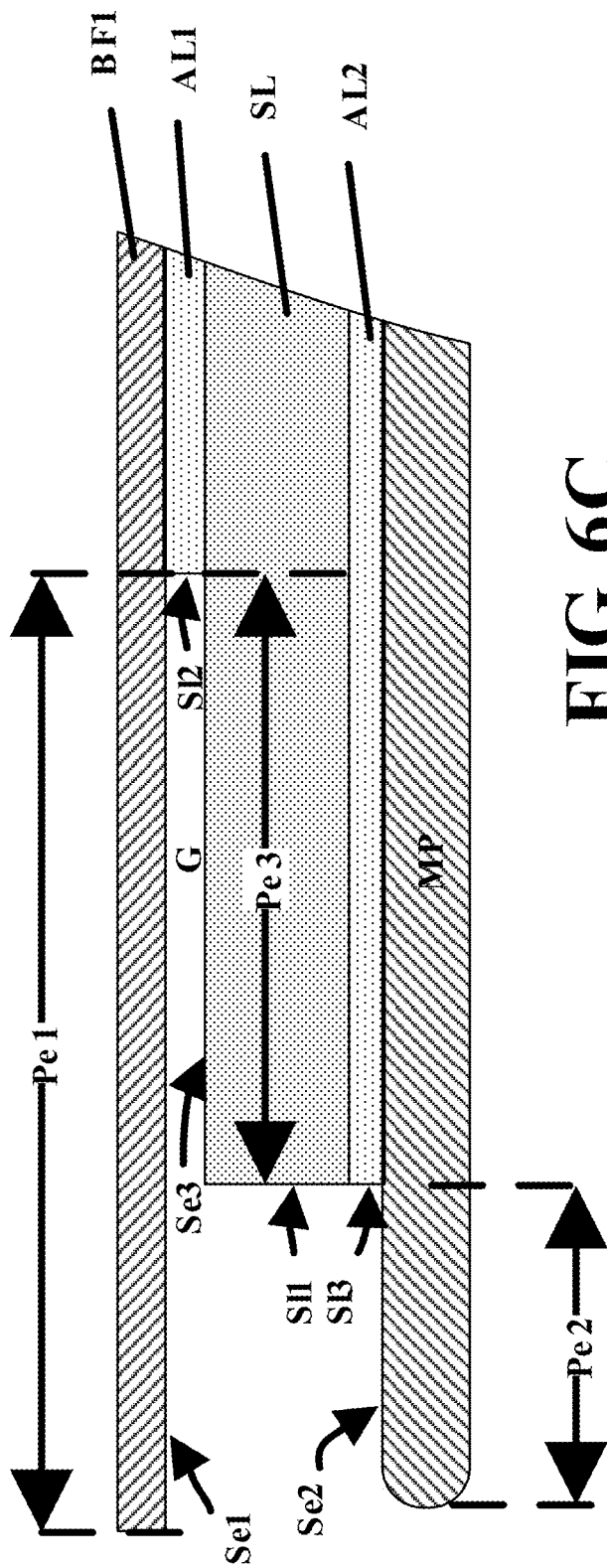
FIG. 6C is a schematic diagram illustrating a partial structure of a region around a stress-reducing space in a display apparatus in some embodiments according to the present disclosure.

FIG. 6A is a cross-section view around a bending portion of a display apparatus in some embodiments according to the present disclosure. FIG. 6B is a zoom-in view of a region around a stress-reducing space and a bending cavity in a display apparatus in some embodiments according to the present disclosure. FIG. 6C is a schematic diagram illustrating a partial structure of a region around a stress-reducing space in a display apparatus in some embodiments according to the present disclosure. Referring to FIG. 6A to FIG. 6C, in some embodiments, the stress-reducing space Ssr further extends into a gap G between the first back film BF1 and the support layer SL. The first adhesive layer AL1 is absent in the gap G.

In some embodiments, the stress-reducing space Ssr has a first side wall Ws1 including a first exposed surface Se1 of a first exposed portion Pe1 of the first back film BF1; a second side wall Ws2 including a second exposed surface Se2 of a second exposed portion Pe2 of the metal plate MP; and a third side wall Ws3 including a first surface S11 of the support layer SL, a second surface S12 of the first adhesive layer AL1, a third surface S13 of the second adhesive layer AL2, and a third exposed surface Se3 of a third exposed portion Pe3 of the support layer SL. The stress-reducing space Ssr is open to the bending cavity Cpb that is partially surrounded by the bending portion PBP. The gap G has a first side wall including a portion of the first exposed surface Se1, a second side wall including the third exposed surface Se3, and a third side wall including the second surface S12. One side of the gap G is open to a remainder of the stress-reducing space Ssr.

In some embodiments, the third side wall Ws3 is a step wall. Optionally, the third exposed surface Se3 is substantially parallel to the first exposed surface Se1 and the second exposed surface Se2. Optionally, the first surface S11 of the support layer SL, the second surface S12 of the first adhesive layer AL1, and the third surface S13 of the second adhesive layer AL2 are respectively substantially perpendicular to the first exposed surface Se1, the second exposed surface Se2, and the third exposed surface Se3. Optionally, the third exposed surface Se3 connects the first surface S11 of the support layer SLI and the second surface S13 of the first adhesive layer AL1. As used herein, the term "substantially parallel" refers to two surfaces forming a dihedral angle between them, and the dihedral angle is in a range of 0 degree to 15 degrees, e.g., 0 degree to 1 degree, 1 degree to 2 degrees, 2 degrees to 5 degrees, 5 degrees to 10 degrees, or 10 degrees to 15 degrees. As used herein, the term "substantially parallel" refers to two surfaces forming a dihedral angle between them, and the dihedral angle is in a range of 75 degree to 90 degrees, e.g., 75 degrees to 80 degrees, 80 degrees to 85 degrees, 85 degrees to 88 degrees, 88 degrees to 89 degrees, or 89 degrees to 90 degrees.

Figure 6D:
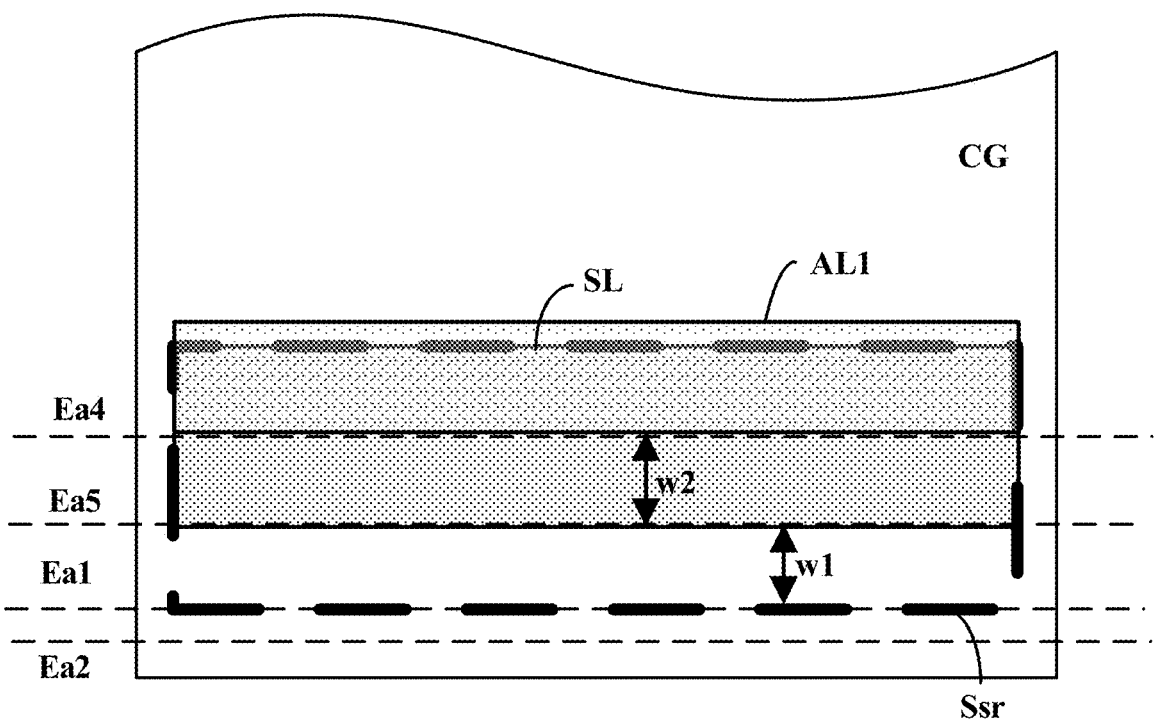
FIG. 6D is a plan view of a support layer, a first adhesive layer, and a cover window in a display apparatus in some embodiments according to the present disclosure.
Figure 6E:
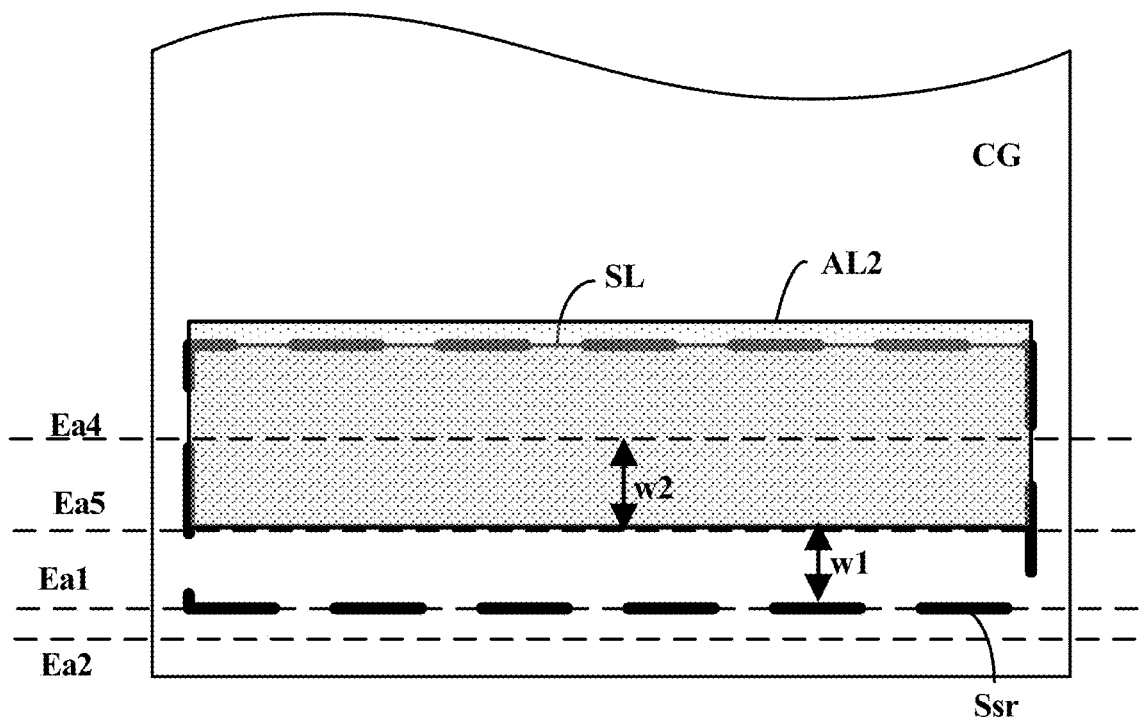
FIG. 6E is a plan view of a support layer, a second adhesive layer, and a cover window in a display apparatus in some embodiments according to the present disclosure.

FIG. 6D is a plan view of a support layer, a first adhesive layer, and a cover window in a display apparatus in some embodiments according to the present disclosure. FIG. 6E is a plan view of a support layer, a second adhesive layer, and a cover window in a display apparatus in some embodiments according to the present disclosure. Referring to FIG. 6A to FIG. 6E, in some embodiments, an orthographic projection of the first back film BF1 on the cover window CG covers an orthographic projection of the support layer SL on the cover window CG by a first margin having a first width w1 greater than zero along a direction from the support layer SL to the bending portion PBP. As shown in FIG. 6A to FIG. 6E, an orthographic projection of a first edge Ea1 of the first back film BF1 on the cover window CG is non-overlapping with an orthographic projection of a third edge Ea3 of the support layer SL on the cover window CG. The orthographic projection of the first edge Ea1 of the first back film BF1 on the cover window CG is spaced apart from the orthographic projection of the third edge Ea3 of the support layer SL on the cover window CG by the first width w1 greater than zero. Optionally, the first width w1 is in a range of 20 μm to 1500 μm, e.g., 20 μm to 100 μm, 100 μm to 200 μm, 200 μm to 300 μm, 300 μm to 400 μm, 400 μm to 500 μm, 500 μm to 600 μm, 600 μm to 700 μm, 700 μm to 800 μm, 800 μm to 900 μm, 900 μm to 1000 μm, 1000 μm to 1100 μm, 1100 μm to 1200 μm, 1200 μm to 1300 μm, 1300 μm to 1400 μm, or 1400 μm to 1500 μm.

Referring to FIG. 6A to FIG. 6E, in some embodiments, an orthographic projection of the second adhesive layer AL2 on the cover window CG covers an orthographic projection of the first adhesive layer AL1 on the cover window CG by a second margin having a second width w2 greater than zero along a direction from the support layer SL to the bending portion PBP. An orthographic projection of a fourth edge Ea4 of the first adhesive layer AL1 on the cover window CG is non-overlapping with an orthographic projection of a fifth edge Ea5 of the second adhesive layer AL2 on the cover window CG. The orthographic projection of the fourth edge Ea4 of the first adhesive layer AL1 on the cover window CG is spaced apart from the orthographic projection of the fifth edge Ea5 of the second adhesive layer AL2 on the cover window CG by the second width w2 greater than zero. Optionally, the orthographic projection of the fifth edge Ea5 of the second adhesive layer AL2 on the cover window CG overlaps with the orthographic projection of the third edge Ea3 of the support layer SL on the cover window CG. Optionally, The orthographic projection of the fourth edge Ea4 of the first adhesive layer AL1 on the cover window CG is spaced apart from the orthographic projection of the third edge Ea3 of the support layer SL on the cover window CG by the second width w2 greater than zero. Optionally, the second width w2 is in a range of 100 μm to 3000 μm, e.g., 100 μm to 250 μm, 250 μm to 500 μm, 500 μm to 750 μm, 750 μm to 1000 μm, 1000 μm to 1250 μm, 1250 μm to 1500 μm, 1500 μm to 1750 μm, 1750 μm to 2000 μm, 2000 μm to 2250 μm, 2250 μm to 2500 μm, 2500 μm to 2750 μm, or 2750 μm to 3000 μm.

Optionally, the second width w2 referred to a minimum width of the second margin, or a minimum spaced apart distance between the orthographic projection of the fourth edge Ea4 of the first adhesive layer AL1 on the cover window CG and the orthographic projection of the fifth edge Ea5 of the second adhesive layer AL2 on the cover window CG.

Optionally, the second width w2 referred to an average width of the second margin, or an average spaced apart distance between the orthographic projection of the fourth edge Ea4 of the first adhesive layer AL1 on the cover window CG and the orthographic projection of the fifth edge Ea5 of the second adhesive layer AL2 on the cover window CG.

Optionally, the second width w2 referred to a maximum width of the second margin, or a maximum spaced apart distance between the orthographic projection of the fourth edge Ea4 of the first adhesive layer AL1 on the cover window CG and the orthographic projection of the fifth edge Ea5 of the second adhesive layer AL2 on the cover window CG.

The present display apparatus has a stress-reducing space Ssr for reducing tensile stress that causes damages in the signal lines. The inventors of the present disclosure discover that the stress-reducing space Ssr significantly reduces the tensile stress in regions adjacent to the bending portion PBP. For example, a maximum tensile stress measured in regions adjacent to the bending portion PBP in the display apparatus as shown in FIG. 6A is approximately 0.00266 pascal when the width w2 is approximately 1000 μm. In comparison, the maximum tensile stress measured at the position Pmt in FIG. 3 or FIG. 4 is 0.00484 pascal. Surprisingly and unexpected, the maximum tensile stress can be reduced by as much as 45% in the present display apparatus.

Referring to FIG. 5A to FIG. 5E, and FIG. 6A to FIG. 6E, in some embodiments, the flexible base substrate FBS extends throughout the display portion DP, the bending portion PBP and the connecting portion CP as a unitary structure. The bending cavity Cpb is partially surrounded by a part of the flexible base substrate FBS in the bending portion PBP. A virtual boundary through which the stress-reducing space Ssr and the bending cavity Cpb open to each other is defined by a plane crossing over a first edge Ea1 of the first back film BF1 abutting the bending portion PBP.

Referring to FIG. 5A to FIG. 5E, and FIG. 6A to FIG. 6E, in some embodiments, an orthographic projection of the second back film BF2 on the cover window CG covers an orthographic projection of the first back film BF1 on the cover window CG by a third margin having a third width w3 greater than zero along a direction from the support layer SL to the bending portion PBP. An orthographic projection of a second edge Ea2 of the second back film BF2 on the cover window CG is non-overlapping with an orthographic projection of a first edge Ea1 of the first back film BF1 on the cover window CG. The orthographic projection of the second edge Ea2 of the second back film BF2 on the cover window CG is spaced apart from the orthographic projection of the first edge Ea1 of the first back film BF1 on the cover window CG by the third width w3 greater than zero.

In some embodiments, the display apparatus further includes a flexible printed circuit bonded to the connecting portion. Optionally, the display apparatus is a liquid crystal display apparatus. Optionally, the display apparatus is an organic light emitting diode display apparatus. Examples of appropriate display apparatuses include, but are not limited to, an electronic paper, a mobile phone, a tablet computer, a television, a monitor, a notebook computer, a digital album, a GPS, etc.

Figure 7A:
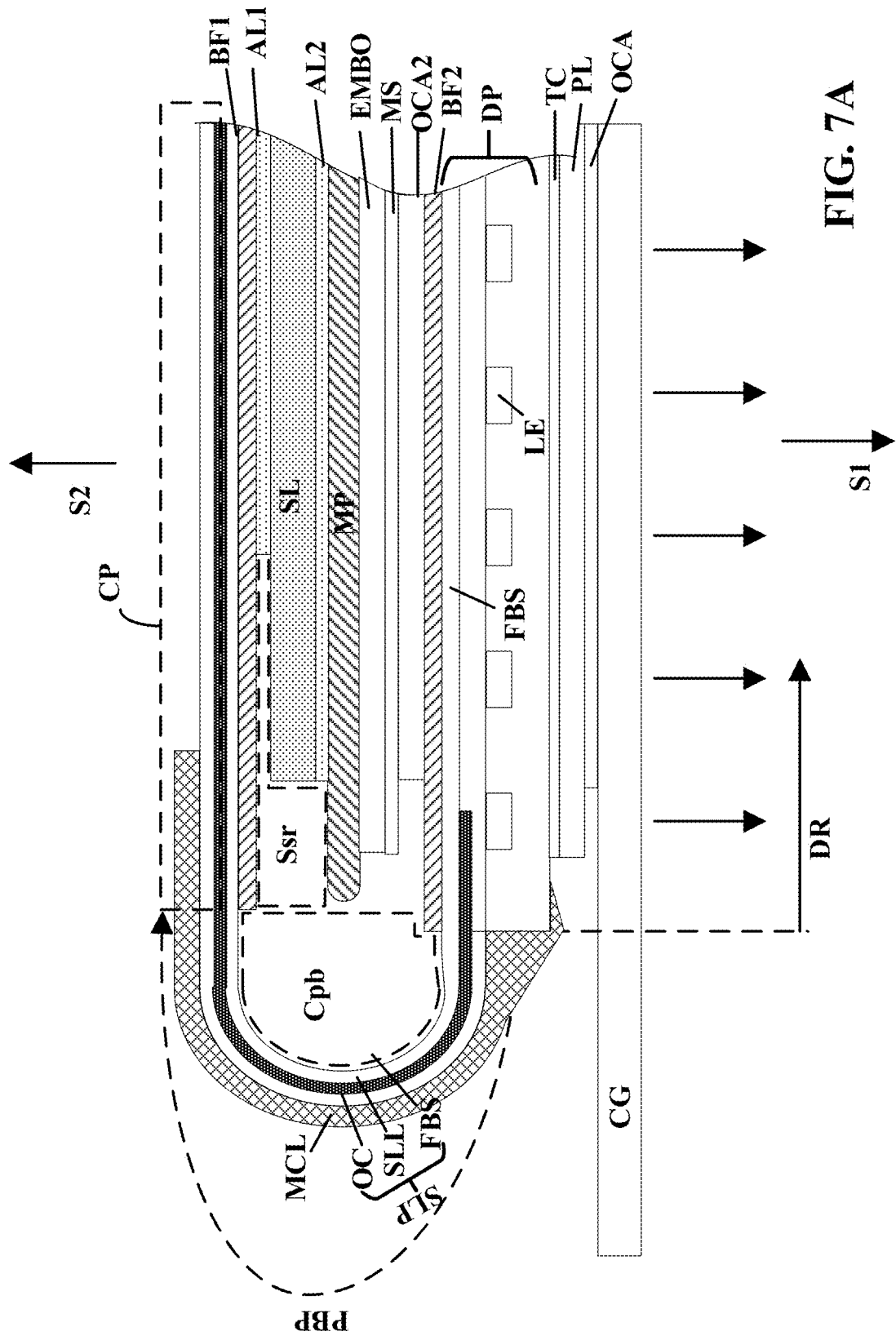
FIG. 7A is a cross-section view around a bending portion of a display apparatus in some embodiments according to the present disclosure.

FIG. 7A is a cross-section view around a bending portion of a display apparatus in some embodiments according to the present disclosure. Referring to FIG. 7A, in some embodiments, the display apparatus further includes a second optically clear adhesive layer OCA2 between the metal support layer MS and the second back film BF2. The second optically clear adhesive layer OCA2 attaches the metal support layer MS and the second back film BF2 together. Optionally, the second optically clear adhesive layer OCA2 has a thickness that is 1.5 times to 2.5 times of a thickness of the metal support layer MS.

In some embodiments, the display apparatus further includes an Embo-type adhesive layer EMBO between the metal support layer MS and the metal plate MP. The Embo-type adhesive layer EMBO attaches the metal support layer MS and the metal plate MP together. The Embo-type adhesive layer EMBO has a mesh pattern structure that facilitates releasing air between the metal support layer MS and the metal plate MP when they are attached together. Optionally, the Embo-type adhesive layer EMBO has a thickness that is 1.5 times to 2.5 times of a thickness of the metal support layer MS.

Figure 7B:
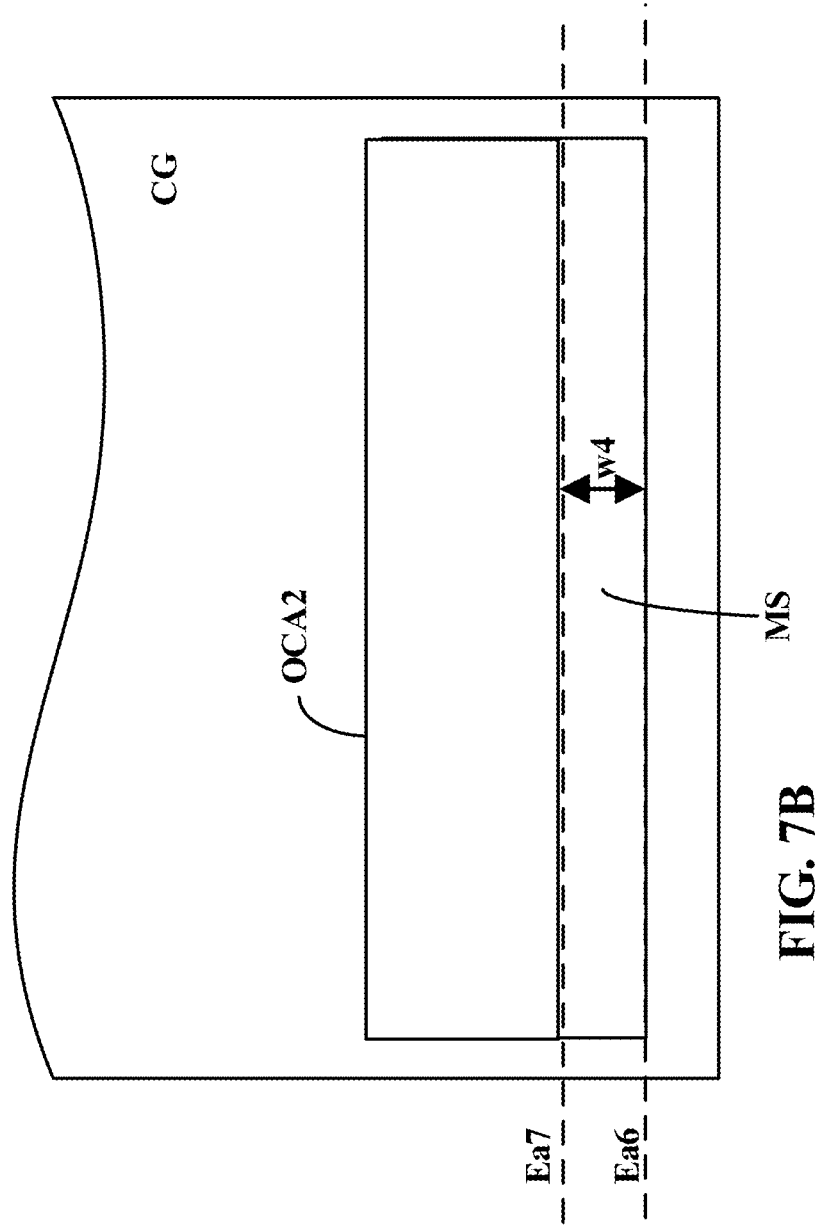
FIG. 7B is a plan view of a metal support layer, a second optically clear adhesive layer, and a cover window in a display apparatus in some embodiments according to the present disclosure.

FIG. 7B is a plan view of a metal support layer, a second optically clear adhesive layer, and a cover window in a display apparatus in some embodiments according to the present disclosure. Referring to FIG. 7A and FIG. 7B, in some embodiments, an orthographic projection of the metal support layer MS on the cover window CG covers an orthographic projection of the second optically clear adhesive layer OCA2 on the cover window CG by a fourth margin having a fourth width w4 greater than zero along a direction from the support layer SL to the bending portion PBP. As shown in FIG. 7A and FIG. 7B, an orthographic projection of a sixth edge Ea6 of the metal support layer MS on the cover window CG is non-overlapping with an orthographic projection of a seventh edge Ea7 of the second optically clear adhesive layer OCA2 on the cover window CG. The orthographic projection of the sixth edge Ea6 of the metal support layer MS on the cover window CG is spaced apart from the orthographic projection of the seventh edge Ea7 of the second optically clear adhesive layer OCA2 on the cover window CG by the fourth width w4 greater than zero. Optionally, the fourth width w4 is in a range of 50 μm to 500 μm, e.g., 50 μm to 100 μm, 100 μm to 150 μm, 150 μm to 200 μm, 200 μm to 250 μm, 250 μm to 300 μm, 300 μm to 350 μm, 350 μm to 400 μm, 400 μm to 450 μm, or 450 μm to 500 μm. Optionally, the fourth width w4 is 200 μm.

In some embodiments, the first adhesive layer AL1 and the second adhesive layer AL2 are made of a pressure sensitive adhesive (PSA) material.

In some embodiments, the support layer SL has a thickness in a range of 100 μm to 200 μm, e.g., 100 μm to 125 μm, 125 μm to 150 μm, 150 μm to 175 μm, or 175 μm to 200 μm. Optionally, the support layer SL has a thickness of 150 μm.

In some embodiments, the first adhesive layer AL1 has a thickness in a range of 25 μm to 75 μm, e.g., 25 μm to 35 μm, 35 μm to 45 μm, 45 μm to 55 μm, 55 μm to 65 μm, or 65 μm to 75 μm. Optionally, the first adhesive layer AL1 has a thickness of 50 μm.

In some embodiments, the second adhesive layer AL2 has a thickness in a range of 25 μm to 75 μm, e.g., 25 μm to 35 μm, 35 μm to 45 μm, 45 μm to 55 μm, 55 μm to 65 μm, or 65 μm to 75 μm. Optionally, the second adhesive layer AL2 has a thickness of 50 μm.

In some embodiments, the connecting portion CP and the display portion DP are parts of a stacked structure in the display apparatus. Referring to FIG. 7A, the display portion DP may be used as a reference for describing the structure of the stacked structure. On a light emitting image display side S1 of the display portion DP, the stacked structure in some embodiments includes one or more of a touch control structure TC on the display portion DP; a polarizer PL on a side of the touch control structure TC away from the display portion DP; an optically clear adhesive layer OCA on a side of the polarizer PL away from the touch control structure TC; and a cover window CG on a side of the optically clear adhesive layer OCA away from the polarizer PL. The optically clear adhesive layer OCA attaches the cover window CG to the polarizer. On a back side S2 of the display portion DP, the stacked structure in some embodiments includes one or more of a second back film BF2 on the display portion DP, a second optically clear adhesive layer OCA2 on a side of the second back film BF2 away from the display portion DP; a metal support layer MS on a side of the second optically clear adhesive layer OCA2 away from the second back film BF2; an Embo-type adhesive layer EMBO on a side of the metal support layer MS away from the second optically clear adhesive layer OCA2; a metal plate MP on a side of the Embo-type adhesive layer EMBO away from the metal support layer MS; a second adhesive layer AL2 on a side of the metal plate MP away from the metal support layer MS; a support layer SL on a side of the second adhesive layer AL2 away from the metal plate MP; a first adhesive layer AL1 on a side of the support layer SL away from the second adhesive layer AL2, a first back film BF1 on a side of the first adhesive layer AL1 away from the support layer SL; a flexible base substrate FBS on a side of the first back film BF1 away from the first adhesive layer AL1; a signal line layer SLL on a side of the flexible base substrate FBS away from the first back film BF1; and an overcoat layer OC on a side of the signal line layer SLL away from the flexible base substrate FBS.

In another aspect, the present disclosure provides a method of fabricating a display apparatus. In some embodiments, the method includes forming a display panel comprising a display portion in a display region, a connecting portion, and a bending portion connecting the display portion and the connecting portion, wherein a flexible base substrate extends throughout the display portion, the bending portion and the connecting portion as a unitary structure that is substantially flat; forming a back film covering a surface of the flexible base substrate; removing a portion of the back film in a region having the bending portion, thereby forming a first back film covering a surface of the connecting portion and a second back film covering a surface of the display portion; bending the bending portion so that the first back film is facing the second back film, thereby forming a bending cavity; providing a support layer between the display portion and the connecting portion; providing a first adhesive layer to attach the support layer to the first back film; providing a metal plate between the support layer and the display portion; and providing a second adhesive layer to attach the support layer to the metal plate. Optionally, the support layer is provided to form a stress-reducing space having a first side wall comprising a first exposed surface of a first exposed portion of the first back film, a second side wall comprising a second exposed surface of a second exposed portion of the metal plate, and a third side wall comprising a first surface of the support layer. Optionally, the stress-reducing space is open to the bending cavity. As used herein, the term "substantially flat" may include small deviations from flat surface geometries, for example, deviations due to manufacturing processes.

Figures 8A, 8B:
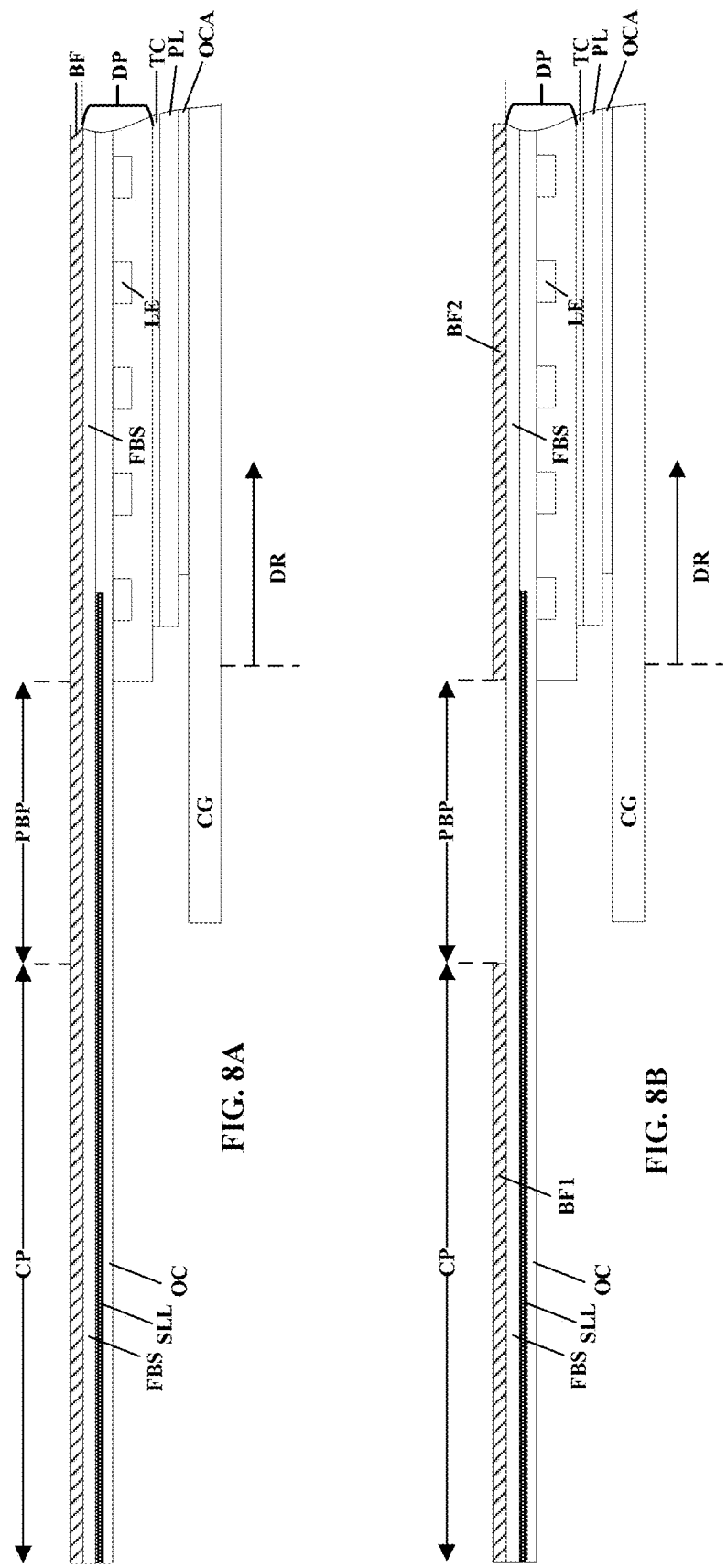
FIG. 8A to FIG. 8D illustrate a method of fabricating a display apparatus in some embodiments.

FIG. 8A to FIG. 8D illustrate a method of fabricating a display apparatus in some embodiments. Referring to FIG. 8A, a display panel having a display portion DP in a display region DR, a connecting portion CP, and a bending portion PBP connecting the display portion DP and the connecting portion CP is formed. A flexible base substrate FBS in the structure extends throughout the display portion DP, the bending portion PBP, and the connecting portion CP as a unitary structure that is substantially flat. A back film BF is formed to cover a surface of the flexible base substrate FBS, e.g., a surface of the flexible base substrate FBS on a side away from the cover window CG.

Referring to FIG. 8B, a portion of the back film in a region having the bending portion PBP is then removed, thereby forming a first back film BF1 covering a surface of the connecting portion CP and a second back film BF2 covering a surface of the display portion DP.

Figure 8C:
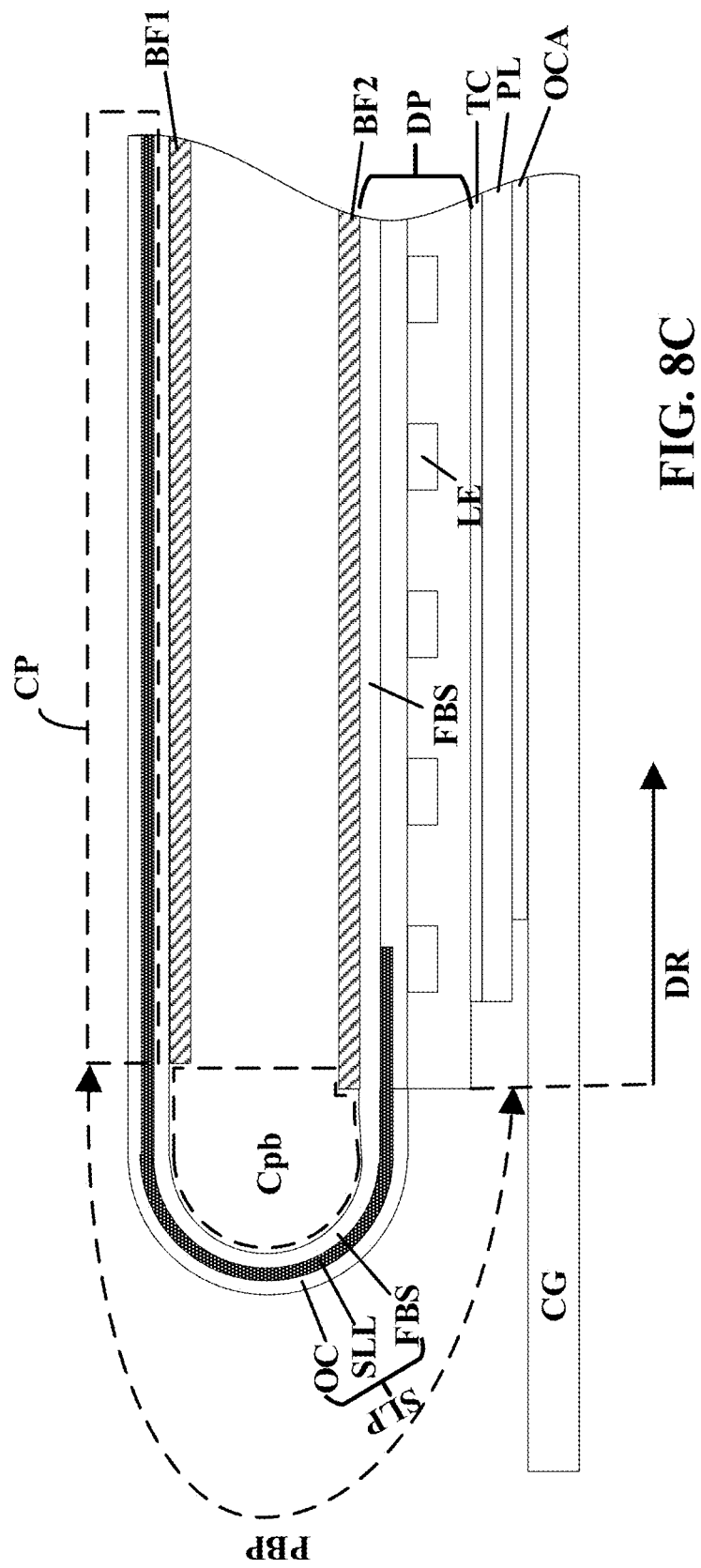

Referring to FIG. 8C, the bending portion PBP is then bent so that the first back film BF1 is facing the second back film BF2, thereby forming a bending cavity Cpb that is partially surrounded by the bending portion PBP.

Figure 8D:
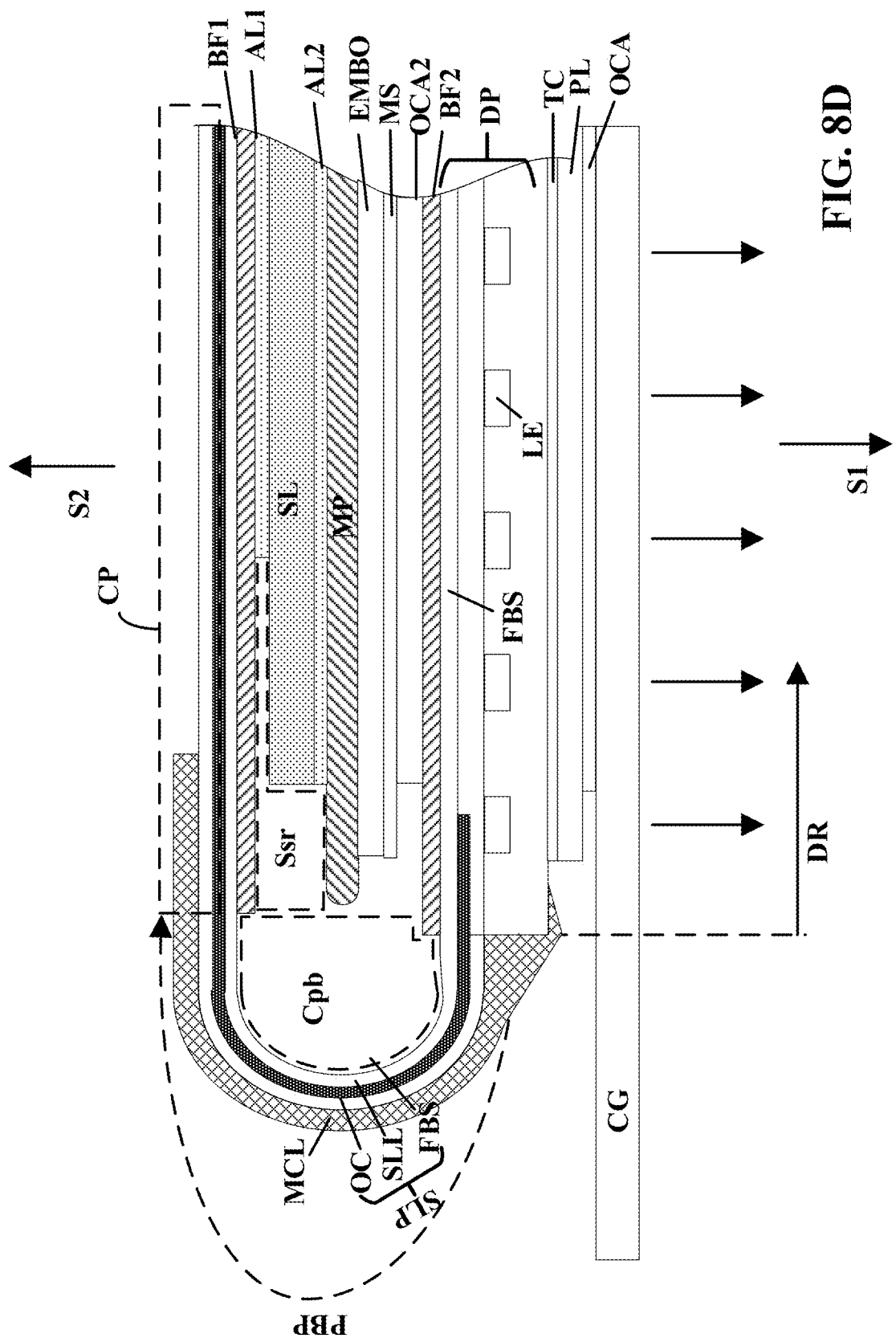

Referring to FIG. 8D, a support layer SL is provided between the display portion DP and the connecting portion CP; a first adhesive layer AL1 is provided to attach the support layer SL to the first back film BF1; a metal plate MP is provided between the support layer SL and the display portion DP; and a second adhesive layer AL2 is provided to attach the support layer SL to the metal plate MP. As shown in FIG. 8D, FIG. 6B, and FIG. 6C, the support layer SL is provided to form a stress-reducing space Ssr having a first side wall Ws1 including a first exposed surface Se1 of a first exposed portion Pe1 of the first back film BF1, a second side wall Ws2 including a second exposed surface Se2 of a second exposed portion Pe2 of the metal plate MP, and a third side wall Ws3 including a first surface S11 of the support layer SL. The stress-reducing space Ssr is formed to be open to the bending cavity Cpb.

Optionally, the first adhesive layer AL1 is provided to only a portion of the space between the support layer SL and the first back film BF1, thereby forming a gap G between the first back film BF1 and the support layer SL, the first adhesive layer AL1 being absent in the gap G. The gap G is a part of the stress-reducing space Ssr, and is open to a reminder of the stress-reducing space Ssr. Referring to FIG. 8D and FIG. 6C, the gap G is formed to have a first side wall including a portion of the first exposed surface Se1, a second side wall including the third exposed surface Se3, and a third side wall including the second surface S12. One side of the gap G is open to a remainder of the stress-reducing space Ssr.

Optionally, an Embo-type adhesive layer EMBO, a metal support layer MS, a second optically clear adhesive layer OCA2 is provided between the metal plate MP and the second back film BF2. The Embo-type adhesive layer EMBO is provided between the metal plate MP and the metal support layer MS, and attaches the metal plate MP and the metal support layer MS together. The second optically clear adhesive layer OCA2 is provided between the metal support layer MS and the second back film BF2, and attaches the metal support layer MS and the second back film BF2 together.

In some embodiments, the method further includes forming a stacked structure. Referring to FIG. 8D, the display portion DP may be used as a reference for describing the method for forming the stacked structure. On a light emitting image display side S1 of the display portion DP, forming the stacked structure in some embodiments includes one or more steps of: forming a touch control structure TC on the display portion DP; forming a polarizer PL on a side of the touch control structure TC away from the display portion DP; forming an optically clear adhesive layer OCA on a side of the polarizer PL away from the touch control structure TC; and forming a cover window CG on a side of the optically clear adhesive layer OCA away from the polarizer PL. The optically clear adhesive layer OCA is formed to attach the cover window CG to the polarizer. On a back side S2 of the display portion DP, forming the stacked structure in some embodiments includes one or more steps of: providing a second optically clear adhesive layer OCA2 on a side of the second back film BF2 away from the display portion DP; providing a metal support layer MS on a side of the second optically clear adhesive layer OCA2 away from the second back film BF2; providing an Embo-type adhesive layer EMBO on a side of the metal support layer MS away from the second optically clear adhesive layer OCA2; providing a metal plate MP on a side of the metal support layer MS away from the Embo-type adhesive layer EMBO; providing a second adhesive layer AL2 on a side of the metal plate MP away from the metal support layer MS; providing a support layer SL on a side of the second adhesive layer AL2 away from the metal plate MP; providing a first adhesive layer AL1 on a side of the support layer SL away from the second adhesive layer AL2; and providing a first back film BF1 on a side of the first adhesive layer AL1 away from the support layer SL. The second adhesive layer AL2 is optionally provided to attach the metal plate MP and the support layer SL together. The first adhesive layer AL1 is optionally provided to attach the support layer SL and the first back film BF1 together.

Optionally, the method further includes forming a coating layer MCL on a side of the signal line portion SLP away from the bending cavity Cpb.

Various appropriate materials and various appropriate fabricating methods may be used to make the metal plate. For example, a metallic material may be used to form the metal plate. Examples of appropriate metallic materials include, but are not limited to, aluminum and copper, and various appropriate alloys or laminates.

Various appropriate materials and various appropriate fabricating methods may be used to make the metal support layer. For example, a metallic material may be used to form the metal support layer. Examples of appropriate metallic materials include, but are not limited to, aluminum and copper, and various appropriate alloys or laminates.

Various appropriate materials and various appropriate fabricating methods may be used to make the support layer. For example, an organic polymer material may be used to form the support layer. Examples of appropriate organic polymer materials include, but are not limited to, polyethylene terephthalate.

Various appropriate materials and various appropriate fabricating methods may be used to make the first back film and the second back film. For example, a flexible organic polymer material may be used to form the first back film and the second back film. Examples of appropriate flexible organic polymer materials include, but are not limited to, polyimide, polycarbonate, polyethersulfone, polyethylene terephthalate, polyethylene naphthalate, polyarylate, and fiber-reinforced plastic.

Various appropriate materials and various appropriate fabricating methods may be used to make the flexible base substrate. For example, a flexible organic polymer material may be used to form the flexible base substrate. Examples of appropriate flexible organic polymer materials include, but are not limited to, polyimide, polycarbonate, polyethersulfone, polyethylene terephthalate, polyethylene naphthalate, polyarylate, and fiber-reinforced plastic.

Various appropriate materials and various appropriate fabricating methods may be used to make the coating layer. For example, a UV curable adhesive material may be used to form the coating layer. Examples of UV curable adhesives include UV curable adhesive materials that contain a free radical generating photoinitiator and a compound having multiple unsaturated groups (e.g., acrylate, methacrylate or vinyl groups), such as an oligomer having multiple unsaturated groups and, optionally, a monomer having multiple unsaturated groups. Specific examples of free radical generating photoinitiators include, for example, type I or type II photoinitiators, such as benzoin ether, 1-hydroxy-cyclohexylphenyl-ketone or benzophenone, among others. Specific examples of oligomers having multiple unsaturated groups include acrylate oligomers such as epoxy acrylates (e.g., bisphenol-A-epoxy acrylate), aliphatic urethane acrylates (e.g., IPDI-based aliphatic urethane acrylates), aromatic urethane acrylates, polyether acrylates, polyester acrylates, aminated acrylates, and acrylic acrylates. Specific examples of monomers include mono-di- and tri-functional monomers such as trimethylolpropane triacrylate, propoxylated trimethylolpropane triacrylate, ethoxylated trimethylolpropane triacrylate, tripropylene glycol diacrylate, hexanediol diacrylate, isobornyl acrylate, isodecyl acrylate, ethoxylated phenyl acrylate, and 2-phenoxyethyl acrylate, among others. Further examples of UV curable adhesives include UV curable adhesive materials that comprise a cationic photoinitiator and an epoxide compound. Particular examples of cationic photoinitiators include onium salts such as aryl sulfonium and aryl iodonium salts. Specific examples of epoxide compounds include cycloaliphatic epoxide compounds and aromatic epoxide compounds such as 3,4-epoxy-cyclohexylmethyl-3,4-epoxy-cyclohexane-carboxylate and Bisphenol A diglycidyl ether, and polysiloxanes having epoxy groups, among others.

Various appropriate materials and various appropriate fabricating methods may be used to make the first adhesive layer AL1 and the second adhesive layer AL2. For example, a pressure sensitive adhesive material may be used to form the first adhesive layer AL1 and the second adhesive layer AL2. Examples of appropriate pressure sensitive adhesive materials include, but are not limited to, an acrylate-based adhesive material, such as homopolymers and copolymers of acrylic acid, methacrylic acid, isooctyl acrylate, acrylamide, methacrylamide, acrylonitrile, methacrylonitrile, methyl isoamyl acrylate, 2-ethyl hexylacrylate, and butyl acrylate.

Various appropriate materials and various appropriate fabricating methods may be used to make the optically clear adhesive layer OCA and the optically clear adhesive layer OCA2. Examples of appropriate optically clear adhesive materials include, but are not limited to, polyacrylic, e.g., polymethyl methacrylate (PMMA); cyclic olefin copolymer; polycarbonate; epoxies; silicone-based, optically clear adhesive materials; or a combination thereof.

Various appropriate materials and various appropriate fabricating methods may be used to make the Embo-type adhesive layer EMBO. Examples of appropriate Embo-type adhesive materials include, but are not limited to, poly-acrylic, e.g., polymethyl methacrylate (PMMA); cyclic olefin copolymer; polycarbonate; epoxies; silicone-based, optically clear adhesive materials; or a combination thereof.

Various appropriate materials and various appropriate fabricating methods may be used to make the cover window CG. Examples of appropriate materials for making the cover window CG include, but are not limited to, polyamine such as colorless polyamine, thin glass, ultrathin glass, polyacrylate, polymethylmethacrylate, polycarbonate, polyethylene naphthalate, polyvinylidene chloride, polyvinylidene difluoride, polystyrene, an ethylene vinyl alcohol copolymer, and/or a combination thereof. Optionally, the cover window CG has a double-layer structure including a first sub-layer, a second sub-layer, and an adhesive sub-layer adhering the first sub-layer and the second sub-layer together. Optionally, the first sub-layer and the second sub-layer are made of a colorless polyamine, and the adhesive sub-layer is an optically clear adhesive sub-layer. Optionally, the cover window CG further includes a hard coating sub-layer. Optionally, the first sub-layer has a thickness in a range of 60 μm to 120 μm, e.g. 60 μm to 70 μm, 70 μm to 80 μm, 80 μm to 90 μm, 90 μm to 100 μm, 100 μm to 110 μm, or 110 μm to 120 μm. Optionally, the second sub-layer has a thickness in a range of 60 μm to 120 μm, e.g. 60 μm to 70 μm, 70 μm to 80 μm, 80 μm to 90 μm, 90 μm to 100 μm, 100 μm to 110 μm, or 110 μm to 120 μm. Optionally, the adhesive sub-layer has a thickness in a range of 30 μm to 70 μm, e.g. 30 μm to 40 μm, 40 μm to 50 μm, 50 μm to 60 μm, or 60 μm to 70 μm. Optionally, the hard coating sub-layer has a thickness in a range of 5 μm to 15 μm, e.g., 5 μm to 10 μm, or 10 μm to 15 μm.

The foregoing description of the embodiments of the invention has been presented for purposes of illustration and description. It is not intended to be exhaustive or to limit the invention to the precise form or to exemplary embodiments disclosed. Accordingly, the foregoing description should be regarded as illustrative rather than restrictive. Obviously, many modifications and variations will be apparent to practitioners skilled in this art. The embodiments are chosen and described in order to explain the principles of the invention and its best mode practical application, thereby to enable persons skilled in the art to understand the invention for various embodiments and with various modifications as are suited to the particular use or implementation contemplated. It is intended that the scope of the invention be defined by the claims appended hereto and their equivalents in which all terms are meant in their broadest reasonable sense unless otherwise indicated. Therefore, the term "the invention", "the present invention" or the like does not necessarily limit the claim scope to a specific embodiment, and the reference to exemplary embodiments of the invention does not imply a limitation on the invention, and no such limitation is to be inferred. The invention is limited only by the spirit and scope of the appended claims. Moreover, these claims may refer to use "first", "second", etc. following with noun or element. Such terms should be understood as a nomenclature and should not be construed as giving the limitation on the number of the elements modified by such nomenclature unless specific number has been given. Any advantages and benefits described may not apply to all embodiments of the invention. It should be appreciated that variations may be made in the embodiments described by persons skilled in the art without departing from the scope of the present invention as defined by the following claims. Moreover, no element and component in the present disclosure is intended to be dedicated to the public regardless of whether the element or component is explicitly recited in the following claims.

What is claimed is:

1. A display apparatus, comprising:
a display panel having a display portion in a display region, a connecting portion, and a bending portion;
a cover window on a first side of the display portion;
a support layer between the display portion and the connecting portion;
a first back film covering a back surface of the connecting portion, the first back film on a side of the connecting portion closer to the display portion;
a metal plate between the support layer and the display portion;
a second back film covering a surface of the display portion facing the connecting portion; and
a metal support layer between the metal plate and the second back film;
wherein the bending portion connects the display portion and the connecting portion, wherein the bending portion is bent so that the connecting portion is facing a second side of the display portion, forming a bending cavity that is surrounded by the bending portion, the second side being opposite to the first side;
the display apparatus comprises a stress-reducing space having a first side wall comprising a first exposed surface of a first exposed portion of the first back film, a second side wall comprising a second exposed surface of a second exposed portion of the metal plate, and a third side wall comprising a first surface of the support layer; and
the stress-reducing space is open to the bending cavity;
wherein an orthographic projection of the connecting portion on the cover window is non-overlapping with an orthographic projection of the bending portion on the cover window;
the display apparatus comprises a stacked structure in the display region, the stacked structure comprising the first back film, the stress-reducing space, the support layer, the metal plate, the metal support layer, and the second back film;
in at least a first portion of the stacked structure, the first back film, the stress-reducing space, the metal plate, the metal support layer, and the second back film are present, and the support layer is absent;
in at least a second portion of the stacked structure, the first back film, the support layer, the metal plate, the metal support layer, and the second back film are present, and the stress-reducing space is absent;
the connecting portion and the display portion are on opposite sides of the stacked structure; and
the stress-reducing space is adjacent to the bending portion.

2. The display apparatus of claim 1, wherein a first boundary between the bending portion and the connecting portion is along a first edge of the first back film; and
the bending portion is absent of the first back film.

3. The display apparatus of claim 1, wherein a second boundary between the bending portion and the display portion is along a second edge of the second back film; and
the bending portion is absent of the second back film.

4. The display apparatus of claim 1, wherein the cover window is on a side of the display portion away from the support layer; and
an orthographic projection of the first back film on the cover window covers an orthographic projection of the support layer on the cover window by a first margin having a first width greater than zero along a direction from the support layer to the bending portion.

5. The display apparatus of claim 4, wherein the first width is in a range of 200 μm to 500 μm.

6. The display apparatus of claim 1, further comprising:
a first adhesive layer attaching the support layer to the first back film; and
a second adhesive layer attaching the support layer to the metal plate;
wherein the third side wall further comprises a second surface of the first adhesive layer and a third surface of the second adhesive layer.

7. The display apparatus of claim 1, further comprising:
a first adhesive layer attaching the support layer to the first back film; and
a second adhesive layer attaching the support layer to the metal plate;
wherein the stress-reducing space extends into a gap between the first back film and the support layer, the first adhesive layer being absent in the gap.

8. The display apparatus of claim 7, wherein the third side wall further comprises a second surface of the first adhesive layer, a third surface of the second adhesive layer, and a third exposed surface of a third exposed portion of the support layer.

9. The display apparatus of claim 8, wherein the third side wall is a step wall;
the third exposed surface is substantially parallel to the first exposed surface and the second exposed surface;
the second surface of the first adhesive layer, the first surface of the support layer, and the third surface of the second adhesive layer are respectively substantially perpendicular to the first exposed surface, the second exposed surface, and the third exposed surface; and
the third exposed surface connects the first surface of the support layer and the second surface of the first adhesive layer.

10. The display apparatus of claim 7, wherein the cover window is on a side of the display portion away from the support layer; and
an orthographic projection of the second adhesive layer on the cover window covers an orthographic projection of the first adhesive layer on the cover window by a second margin having a second width greater than zero along a direction from the support layer to the bending portion.

11. The display apparatus of claim 10, wherein the second width is in a range of 500 μm to 1000 μm.

12. The display apparatus of claim 1, comprising a flexible base substrate extending throughout the display portion, the bending portion and the connecting portion as a unitary structure;
wherein the bending cavity is partially surrounded by a part of the flexible base substrate in the bending portion; and
a virtual boundary through which the stress-reducing space and the bending cavity open to each other is defined by a plane crossing over a first edge of the first back film abutting the bending portion.

13. The display apparatus of claim 12, comprising a signal line layer extends from the bending portion into the connecting portion;
wherein a part of the signal line layer in the bending portion is on a side of the flexible base substrate away from the bending cavity; and
a part of the signal line layer in the connecting portion is on a side of the flexible base substrate away from the first back film.

14. The display apparatus of claim 13, further comprising an overcoat layer in the bending portion and on a side of the signal line layer away from the flexible base substrate and the bending cavity; and a coating layer in the bending portion and on a side of the overcoat layer away from the signal line layer.

15. The display apparatus of claim 3, wherein the cover window is on a side of the display portion away from the support layer;

wherein an orthographic projection of the second back film on the cover window covers an orthographic projection of the first back film on the cover window by a third margin having a third width greater than zero along a direction from the support layer to the bending portion.

16. The display apparatus of claim 1, further comprising:
a second optically clear adhesive layer between the metal support layer and the second back film, and attaching the metal support layer and the second back film together; and
an Embo-type adhesive layer between the metal support layer and the metal plate, attaching the metal support layer and the metal plate together.

17. The display apparatus of claim 16, wherein an orthographic projection of the metal support layer on the cover window covers an orthographic projection of the second optically clear adhesive layer on the cover window by a fourth margin having a fourth width greater than zero along a direction from the support layer to the bending portion.

18. The display apparatus of claim 15, further comprising a touch control structure on a side of the display portion away from the second back film;

a polarizer on a side of the touch control structure away from the display portion; and
an optically clear adhesive layer on a side of the polarizer away from the touch control structure;
wherein the cover window is on a side of the optically clear adhesive layer away from the polarizer; and
the optically clear adhesive layer attaches the cover window to the polarizer.

19. A method of fabricating a display apparatus, comprising:

forming a display panel comprising a display portion in a display region, a connecting portion, and a bending portion connecting the display portion and the connecting portion, wherein a flexible base substrate extends throughout the display portion, the bending portion and the connecting portion as a unitary structure that is substantially flat;
forming a back film covering a surface of the flexible base substrate;
removing a portion of the back film in a region having the bending portion, thereby forming a first back film covering a surface of the connecting portion and a second back film covering a surface of the display portion;
bending the bending portion so that the first back film is facing the second back film, thereby forming a bending cavity that is surrounded by the bending portion;
providing a support layer between the display portion and the connecting portion;
covering a surface of the display portion facing the connecting portion using a second back film;
providing a metal plate between the support layer and the display portion;
providing a cover window on a first side of the display portion; and
providing a metal support layer between the metal plate and the second back film;
wherein the support layer is provided to form a stress-reducing space having a first side wall comprising a first exposed surface of a first exposed portion of the first back film, a second side wall comprising a second exposed surface of a second exposed portion of the metal plate, and a third side wall comprising a first surface of the support layer; and
the stress-reducing space is open to the bending cavity;
wherein an orthographic projection of the connecting portion on the cover window is non-overlapping with an orthographic projection of the bending portion on the cover window;
the display apparatus comprises a stacked structure in the display region, the stacked structure comprising the first back film, the stress-reducing space, the support layer, the metal plate, the metal support layer, and the second back film;
in at least a first portion of the stacked structure, the first back film, the stress-reducing space, the metal plate, the metal support layer, and the second back film are present, and the support layer is absent;
in at least a second portion of the stacked structure, the first back film, the support layer, the metal plate, the metal support layer, and the second back film are present, and the stress-reducing space is absent;
the connecting portion and the display portion are on opposite sides of the stacked structure; and
the stress-reducing space is adjacent to the bending portion.

20. A display apparatus, comprising:
a display panel having a display portion in a display region, a connecting portion, and a bending portion;
a cover window on a first side of the display portion;
wherein the bending portion connects the display portion and the connecting portion, wherein the bending portion is bent so that the connecting portion is facing a second side of the display portion, forming a bending cavity that is surrounded by the bending portion, the second side being opposite to the first side;
a support layer between the display portion and the connecting portion;
a first back film covering a back surface of the connecting portion, the first back film on a side of the connecting portion closer to the display portion;
a first adhesive layer attaching the support layer to the first back film;
a metal plate between the support layer and the display portion;
a second adhesive layer attaching the support layer to the metal plate;
a second back film covering a surface of the display portion facing the connecting portion;
a metal support layer between the metal plate and the second back film;
a third adhesive layer between the metal support layer and the second back film, and attaching the metal support layer and the second back film together; and
a fourth adhesive layer between the metal support layer and the metal plate, attaching the metal support layer and the metal plate together;
wherein the display apparatus comprises a stress-reducing space having a first side wall comprising a first exposed surface of a first exposed portion of the first back film, a second side wall comprising a second exposed surface of a second exposed portion of the metal plate, and a third side wall comprising a first surface of the support layer;

the stress-reducing space is open to the bending cavity;

a second boundary between the bending portion and the display portion is along a second edge of the second back film;

the bending portion is absent of the second back film;

the cover window is on a side of the display portion away from the support layer; and an orthographic projection of the second back film on the cover window covers an orthographic projection of the first back film on the cover window by a third margin having a third width greater than zero along a direction from the support layer to the bending portion.

* * * * *